(12) United States Patent
Fukuda et al.

(10) Patent No.: US 8,004,185 B2
(45) Date of Patent: Aug. 23, 2011

(54) DISPLAY APPARATUS

(75) Inventors: Koichi Fukuda, Tokyo (JP); Masahiro Okuda, Sagamihara (JP); Hiroshi Matsuda, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 691 days.

(21) Appl. No.: 11/857,823

(22) Filed: Sep. 19, 2007

(65) Prior Publication Data

US 2008/0185954 A1    Aug. 7, 2008

(30) Foreign Application Priority Data

Sep. 28, 2006  (JP) ................................. 2006-264091
Sep. 6, 2007   (JP) ................................. 2007-230941

(51) Int. Cl.
*H01J 1/62* (2006.01)
(52) U.S. Cl. ........................................ 313/506; 313/112
(58) Field of Classification Search .................. 313/506, 313/112
See application file for complete search history.

(56) References Cited

U.S. PATENT DOCUMENTS

| 6,936,960 B2 * | 8/2005 | Cok ............................. 313/506 |
| 7,045,949 B2 | 5/2006 | Yamada et al. ............... 313/504 |
| 2005/0225232 A1 * | 10/2005 | Boroson et al. ............... 313/504 |
| 2005/0253494 A1 | 11/2005 | Choi ............................. 313/112 |
| 2006/0113904 A1 * | 6/2006 | Bae et al. ...................... 313/506 |
| 2007/0096641 A1 | 5/2007 | Hasegawa et al. ............ 313/504 |
| 2007/0236135 A1 | 10/2007 | Fukuda et al. ................ 313/503 |
| 2007/0257609 A1 | 11/2007 | Fukuda et al. ................ 313/506 |

FOREIGN PATENT DOCUMENTS

| JP | 7-142170 | 6/1995 |
| JP | 2002-373776 | 12/2002 |
| JP | 2005/332815 | 12/2005 |

* cited by examiner

*Primary Examiner* — Peter Macchiarolo
(74) *Attorney, Agent, or Firm* — Fitzpatrick, Cella, Harper & Scinto

(57) ABSTRACT

Provided is a display apparatus including: a plurality of pixels each having a plurality of light emitting devices each showing different luminescent colors; and a circularly polarizing member placed on a light extraction side of each of the light emitting devices and being across the light emitting devices to be commonly used by the light emitting devices, in which: the circularly polarizing member shows a higher transmittance for a first luminescent color out of the plurality of luminescent colors in a light emitting device showing the first luminescent color than a transmittance for any other color; and a transmittance for the first luminescent color in a light emitting device showing any other luminescent color is lower than the transmittance for the first luminescent color in the light emitting device showing the first luminescent color.

14 Claims, 10 Drawing Sheets

DISPLAY APPARATUS

BACKGROUND OF THE INVENTION

1. Field of the Invention

The present invention relates to a display apparatus utilizing a light emitting device.

2. Description of the Related Art

An organic electroluminescence (EL) device (which may hereinafter be simply referred to as "device") as one kind of a light emitting device typically has a constitution in which organic layers 101 are interposed between a reflecting electrode 102 and a transparent electrode 103 on a light extraction side as shown in FIG. 1A. Out of light beams emitted from a light emitting point 201, a light beam 203 to be radiated to a side opposite to the light extraction side as well as a light beam 202 to be radiated to the light extraction side is reflected by the reflecting electrode 102 to the light extraction side, whereby a quantity of light to be extracted through the transparent electrode 103 is increased, and emission efficiency is improved.

However, with such constitution, a light beam 301 incident from an outside of the device is also reflected by the reflecting electrode 102 as shown in FIG. 1B, with the result that a contrast of a display reduces and visibility of the display deteriorates. Reference numeral 303 represents a reflected light beam. This is not a problem inherent in an organic EL display but a problem common to light emitting displays each having a reflective electrode, such as an inorganic EL display and a plasma display.

A method of alleviating such contrast reduction involves utilization of a nature in which a right-hand (left-hand) circularly polarized state of light is reversed to a left-hand (right-hand) circularly polarized state by reflection. For example, Japanese Patent No. 2,761,453 proposes a method involving placing a circularly polarizing plate on a light extraction side to prevent reflection of external light. In addition, Japanese Patent Application Laid-Open No. 2005-332815 proposes a method of preventing reflection of external light with a circularly polarizing plate a polarization degree and transmittance of which are changed depending on a wavelength of light.

Another method involves utilization of interference that is caused in lamination of thin films each having a thickness of about several tens of micrometers to about several hundreds of micrometers for preventing reflection of external light. Japanese Patent No. 3,555,759 proposes a method involving combining interference by an optical resonator and a monochromatic absorption filter, and a method involving combining interference by an optical resonator and a red, green, or blue color filter for each device.

The above constitution of Japanese Patent No. 2,761,453 is simple and is excellent in function of preventing the reflection of external light, but the circularly polarizing plate has a transmittance of about 35 to 45% (the theoretical limit is 50%). As a result, there is a problem that emission efficiencies of organic EL devices are uniformly reduced to half irrespective of luminescent colors of the devices.

In addition, Japanese Patent Application Laid-Open No. 2005-332815 suggests that a polarizing plate showing a high transmittance for a certain wavelength range be commonly applied to light emitting devices showing different luminescent colors. With such constitution, light emitted from a light emitting device showing a luminescent color corresponding to the certain wavelength range can be efficiently extracted. However, the constitution of Japanese Patent Application Laid-Open No. 2005-332815 unnecessarily increases a frequency at which external light is reflected in a light emitting device showing any other luminescent color. That is, the efficiency with which light emitted from a light emitting device showing any other luminescent color is extracted cannot be improved, and the frequency at which external light is reflected increases as compared to that in a case of an ordinary circularly polarizing plate.

SUMMARY OF THE INVENTION

The present invention provides a display apparatus in which, while a polarizing plate showing a high transmittance for a certain luminescent color out of a plurality of luminescent colors is used, reflection of external light can be sufficiently prevented without any increase in frequency at which the external light is reflected in a light emitting device showing any other luminescent color. Moreover, the present invention solves such problems with a simple constitution.

According to a first aspect of the present invention, there is provided, for solving the above-mentioned problems of the prior art, a display apparatus including:

a plurality of pixels each having a plurality of light emitting devices each showing different luminescent colors, and a circularly polarizing member placed on a light extraction side of each of the light emitting devices and being across the of light emitting devices to be commonly used by the light emitting devices, the display apparatus being characterized in that: the circularly polarizing member shows a higher transmittance for a first luminescent color out of the plurality of luminescent colors in a light emitting device showing the first luminescent color than a transmittance for any other color; and a transmittance for the first luminescent color in a light emitting device showing any other luminescent color is lower than the transmittance for the first luminescent color in the light emitting device showing the first luminescent color.

In addition, according to a second aspect of the present invention, there is provided a display apparatus including:

a plurality of pixels each having a plurality of light emitting devices each showing different luminescent colors, and a circularly polarizing member on a light extraction side of each of the light emitting devices, the display apparatus being characterized in that the circularly polarizing member is placed on the light extraction side of each of the light emitting devices and on a light emitting device showing a luminescent color other than a first luminescent color out of a plurality of luminescent colors, except a light emitting device showing the first luminescent color.

According to the present invention, while a polarizing plate showing a high transmittance for a certain luminescent color out of the plurality of luminescent colors is used, the reflection of external light can be sufficiently prevented without any increase in frequency at which external light is reflected in a light emitting device showing any other luminescent color. Moreover, the solution of such problems can be realized with a simple constitution including one circularly polarizing member.

Further features of the present invention will become apparent from the following description of exemplary embodiments with reference to the attached drawings.

DESCRIPTION OF THE EMBODIMENTS

Embodiment 1

Figure 1A:
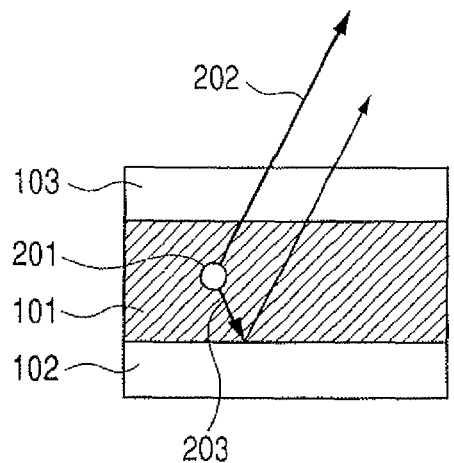
FIGS. 1A and 1B are each a conceptual view showing light emission and external light reflection of an organic EL device.
Figure 1B:
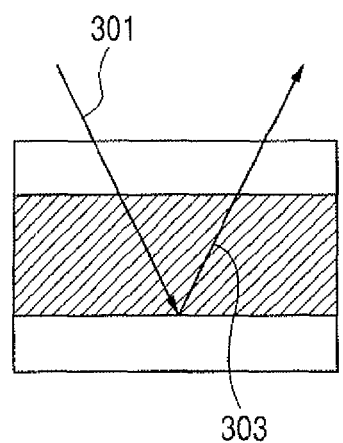

A display apparatus according to this embodiment has a plurality of pixels each having a plurality of light emitting devices showing different luminescent colors. In other words, one pixel has a plurality of light emitting devices, and the respective light emitting devices show different luminescent colors. The term "luminescent color" refers to a color such as a red, blue, or green color and the term strictly refers to a color corresponding to the central wavelength of the emission spectrum of a light emitting device.

In addition, the display apparatus according to this embodiment has a circularly polarizing member placed on the light extraction side of each of the light emitting devices across the plurality of light emitting devices showing different luminescent colors to be common to the devices. In other words, the circularly polarizing member is formed of a single member in in-plane direction of the display apparatus. It should be noted that the circularly polarizing member is formed of: a linearly polarizing member thorough which only a linearly polarized light component in one direction transmits; and a phase difference member through which linearly polarized light components vibrating in main axis directions perpendicular to each other are allowed to pass, and which provides a necessary phase difference between the two components.

In addition, the circularly polarizing member of this embodiment shows a higher transmittance for a first luminescent color out of the plurality of luminescent colors in a light emitting device showing the first luminescent color than a transmittance for any other color. The first luminescent color is one luminescent color selected from the plurality of luminescent colors. The transmittance for the first luminescent color in the light emitting device showing the first luminescent color is higher than the transmittance for any other color, whereby light emitted from the light emitting device showing the first luminescent color can be efficiently extracted to the outside of the device. Further, a transmittance for the first luminescent color in a light emitting device showing any other luminescent color is lower than the transmittance for the first luminescent color in the light emitting device showing the first luminescent color. With such constitution, the reflection of external light in the same wavelength range as that of the first luminescent color can be sufficiently prevented in a light emitting device showing any other luminescent color.

Hereinafter, the embodiment of the display apparatus according to the present invention will be described with reference to the drawings. The display apparatus of this embodiment is a top emission type organic EL display apparatus in which a plurality of pixels are arrayed. In addition, the apparatus has the following constitution: a circularly polarizing plate the spectral polarization degree and spectral transmittance of which are spatially changed in accordance with the characteristics of a sub-pixel of which a pixel is formed is placed, whereby a reduction in B emission efficiency is suppressed in a B sub-pixel, and the reflection of external light is prevented in each of an R sub-pixel and a G sub-pixel. In other words, in this embodiment, the first luminescent color is blue (B).

Figure 2:
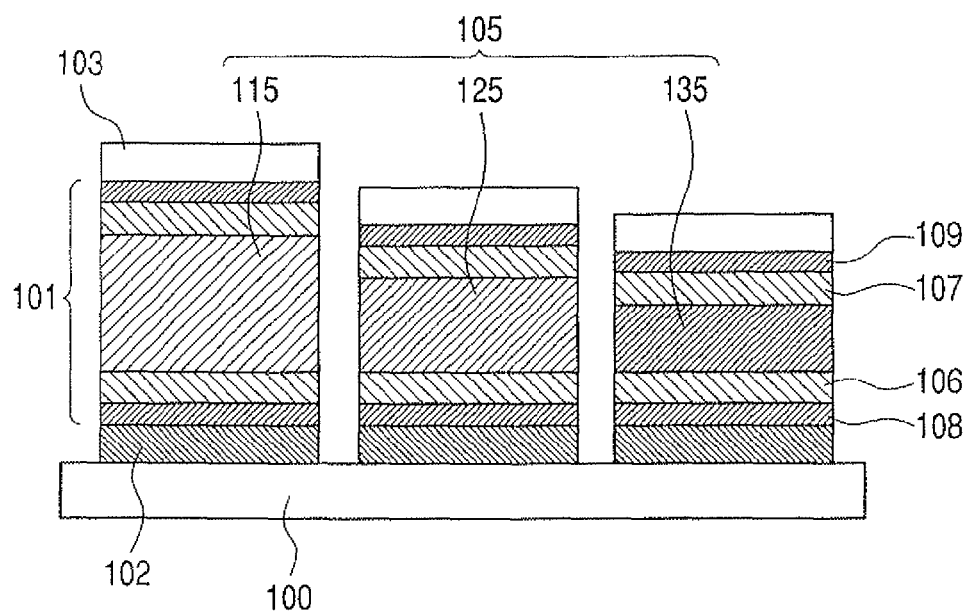
FIG. 2 is a view showing a constitution of a sub-pixel (organic EL device).

As shown in FIG. 2, each of the pixels has organic EL devices forming sub-pixels for three colors, that is, red (R), green (G), and blue (B) colors, and each of the R, G, and B devices is formed by laminating the reflecting electrode 102 as an anode, the organic layer 101, and the transparent electrode 103 as a cathode on a substrate 100. In other words, each of the R, G, and B devices is of a multilayer interference film structure that causes the interference of visible light as in the case of a general device.

Figure 3:
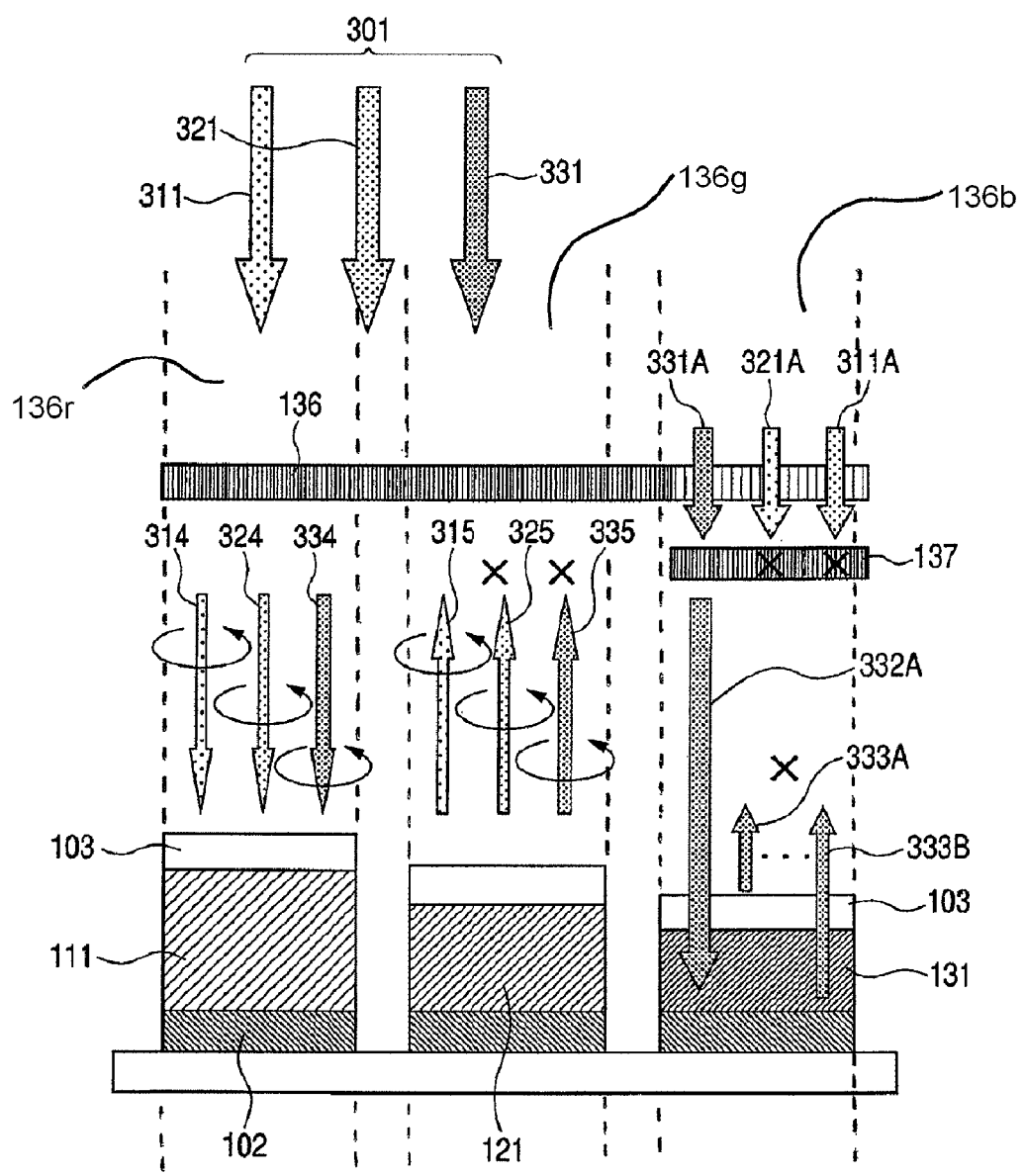
FIG. 3 is a view showing a constitution of a pixel of which a display apparatus according to the present invention is formed.

The organic layer 101 is formed by laminating a hole transporting layer 106, a light-emitting layer 105, and an electron transporting layer 107, and, as shown in FIG. 3, the R, G, and B devices have R organic layer 111, G organic layer 121, and B organic layer 131 containing luminous organic compounds for the respective colors, respectively. An R light emitting layer 115 is formed as the light emitting layer 105 in the R organic layer 111, a G light emitting layer 125 is formed as the light emitting layer 105 in the G organic layer 121, and a B light emitting layer 135 is formed as the light emitting layer 105 in the B organic layer 131.

It should be noted that, as shown in FIG. 2, a hole injecting layer 108 may be interposed between the anode 102 and the hole transporting layer 106 as required, and an electron injecting layer 109 may be interposed between the cathode 103 and the electron transporting layer 107 as required. Organic compounds to be used in the hole transporting layer 106, the light emitting layer 105, the electron transporting layer 107, the hole injecting layer 108, and the electron injecting layer 109 will be described later.

Figure 4:
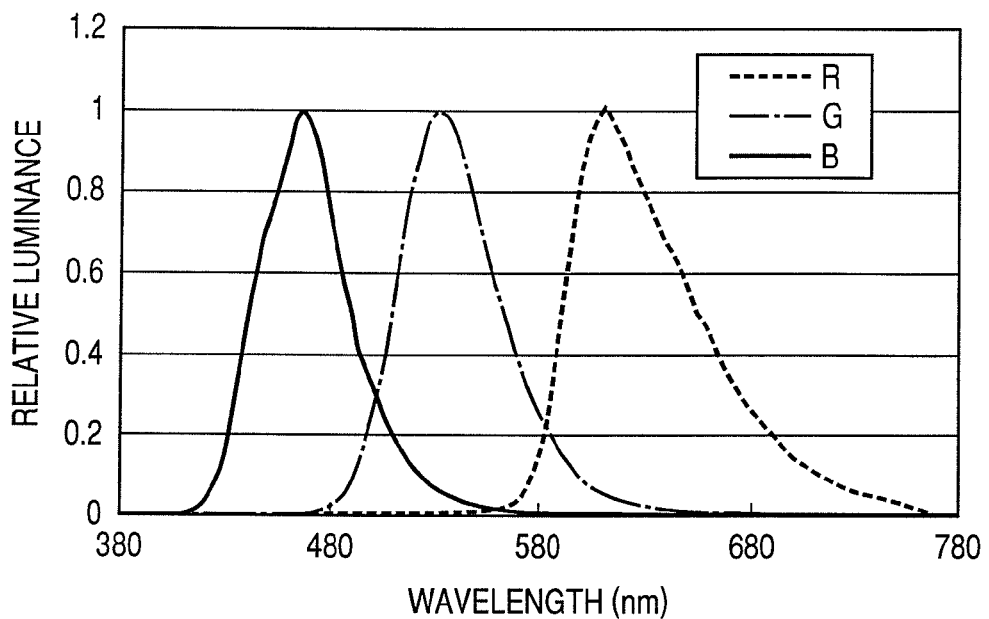
FIG. 4 is a graph showing an example of an emission spectrum (EL spectrum) of an R, G, or B organic EL device.

The application of a voltage to an organic EL device having the above constitution recombines a hole injected from the anode 102 and an electron injected from the cathode 103 in the organic layers 101, whereby light having any one of the R, G, and B colors with, for example, an emission spectrum (EL spectrum) shown in FIG. 4 is emitted.

As shown in FIG. 3, the following three components are added in order that the emission efficiency and contrast of such display apparatus may be improved.

A B region B transmission circularly polarizing plate 136 is placed as a component a on the light extraction side of each organic EL device. The B region B transmission circularly polarizing plate 136 functions as an ordinary circularly polarizing plate between a pixel excluding the light emitting region of a B sub-pixel and an adjacent pixel, and causes only left (right-hand) circularly polarized light components of R, G, and B components to transmit through the plate. On the other hand, in the light emitting region of the B sub-pixel (B light emitting region), the plate serves as an optical member causing more than 50% of each of all or a part of B light emitting components to transmit through the plate. In addition, optical characteristics for R and G components in the B light emitting region are not particularly limited. In FIG. 3, reference numeral 102 represents the reflecting electrode; 103, the transparent electrode; 111, the R organic layer; 121, the G organic layer; 131, the B organic layer; 311A, an R incident light beam; 321A, a G incident light beam; and 331A, a B incident light beam. Hereinafter, the same reference numeral represents the same member, and the description of the member will be omitted.

Hereinafter, an example of a method of producing the B region B transmission circularly polarizing plate 136 will be described.

A product to be frequently used as a linearly polarizing member (linearly polarizing plate) in ordinary cases is obtained by: mixing a polyvinyl alcohol (PVA) film with a dyestuff such as an iodine complex or a dichromatic dye; orienting the dyestuff; and sticking triacetylcellulose (TAC) films to both surfaces of the PVA film. The iodine complex shows strong dichromatism upon orientation, and its absorption peak varies depending on the number of the molecules of polyiodine of which the complex is formed. The absorption spectrum of the linearly polarizing plate can be adjusted by controlling a production ratio between an $I_3^-$-PVA complex having an absorption peak around a light wavelength of 480 nm and an $I_5^-$-PVA complex having an absorption peak around a light wavelength of 600 nm.

Only the B light emitting region of such linearly polarizing plate is irradiated with ultraviolet light. A polarizing action reduces or disappears only in the B light emitting region because the dyestuff such as an iodine complex or a dichromatic dye is decomposed only in the portion irradiated with ultraviolet light. Accordingly, a linearly polarizing plate through which B emitted light transmits in the B light emitting region (B region B transmission linearly polarizing plate) can be obtained. The dyestuff such as an iodine complex or a dichromatic dye may be decomposed by the application of energy such as heat only to the B light emitting region instead of irradiation with ultraviolet light. A region where the polarizing action is reduced and a transmittance is increased is not limited to the B light emitting region, and may be an R light emitting region or a G light emitting region in some cases.

The B region B transmission circularly polarizing plate 136 can be formed by combining the B region B transmission linearly polarizing plate with an ordinary phase difference member (λ/4 phase plate).

Ultraviolet light laser, visible light laser, infrared light laser, or the like with its spot diameter reduced to several micrometers to several tens of micrometers can be used in order that a linearly polarizing plate may be locally subjected to a process such as irradiation with ultraviolet light or heating. A process such as irradiation with ultraviolet light or heating is desirably performed after a linearly polarizing plate or a circularly polarizing plate has been stuck and fixed to a glass substrate or the like in order that the accuracy with which the linearly polarizing plate or the circularly polarizing plate is in alignment with the glass substrate or the like may be improved.

Figure 5:
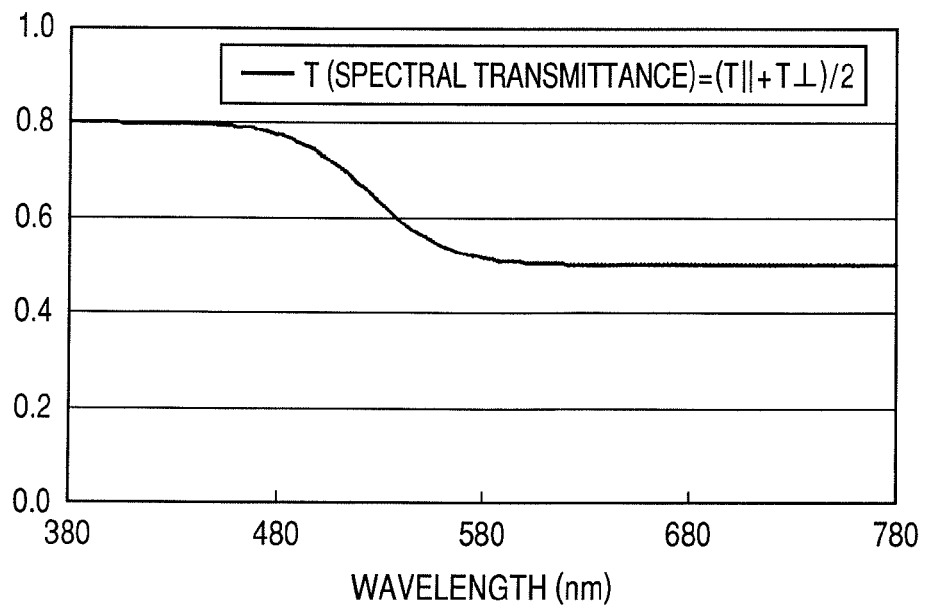
FIG. 5 is a graph exemplifying a spectral transmittance of a B region B transmission circularly polarizing plate.
Figure 6:
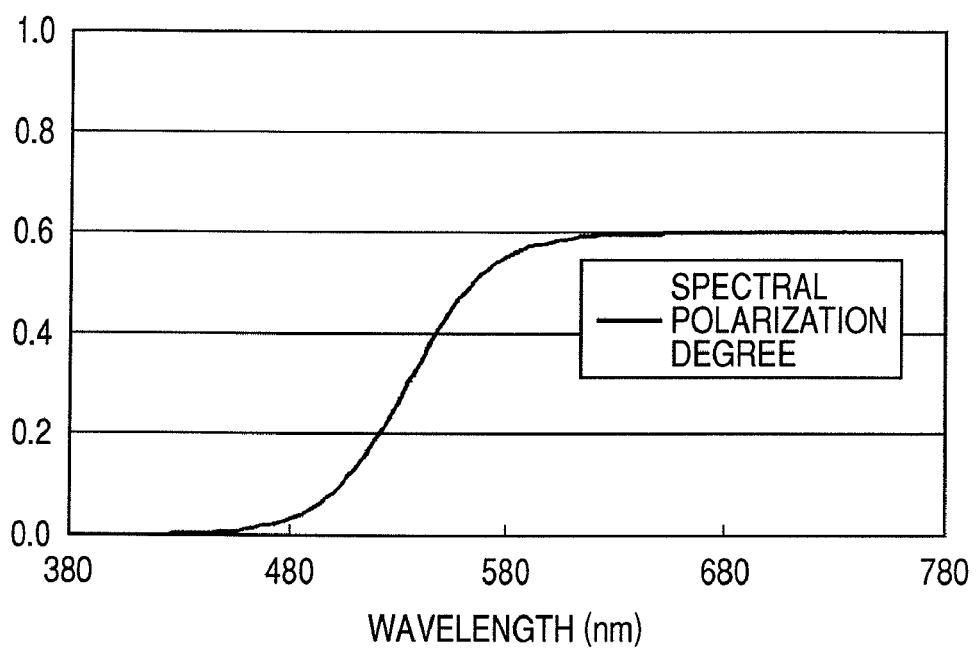
FIG. 6 is a graph exemplifying a spectral polarization degree of the B region B transmission circularly polarizing plate.

FIGS. 5 and 6 show the spectral transmittance and spectral polarization degree of the B region B transmission circularly polarizing plate 136 in a B light emitting region respectively as an example. The plate has such an optical characteristic that the plate partially functions as a circularly polarizing plate for each of R and G light emitting components. The plate has a transmittance of 40% and a polarization degree of 100% in the entire visible range in a pixel region excluding the B light emitting region.

In FIG. 3, the right (left-hand) circularly polarized light component of an R incident light beam 311 of the incident light beams 301 from the outside of the display apparatus is absorbed by the B region B transmission circularly polarizing plate 136 in each of the R and G light emitting regions and between the light emitting regions, whereby an R transmitted left (right-hand) circularly polarized light beam 314 is obtained. In the same manner, the right (left-hand) circularly polarized light component of a G incident light beam 321 and B incident light beam 331 are also absorbed by the B region B transmission circularly polarizing plate 136, whereby a G transmitted left (right-hand) circularly polarized light beam 324 and B transmitted left (right-hand) circularly polarized light beam 334 are obtained, respectively. After that, each of the light beams is reflected at, for example, each multilayer film interface of an organic EL device odd number of times to be turned into each of an R reflected right (left-hand) circularly polarized light beam 315, a G reflected right (left-hand) circularly polarized light beam 325, and a B reflected right (left-hand) circularly polarized light beam 335 each having a reversed circularly polarized state, and the light beams are incident upon the B region B transmission circularly polarizing plate 136 again from the side of the organic EL device to be absorbed by the plate. In contrast, in the B light emitting region, a part of the incident light beams 301 are reflected to be emitted to the light extraction side. However, the reflected light beams have a small influence on the reflection of external light because a ratio of the reflected light beams to the light beams incident upon the B light emitting region is about ⅙.

Therefore, placing the B region B transmission circularly polarizing plate 136 on the light extraction side can partially prevent the reflection of the incident light beams 301, and hence can improve the contrast of the display apparatus.

Meanwhile, a reduction in emission efficiency of B emitted light from a B organic EL device can be avoided because B emitted light transmits through the B region B transmission circularly polarizing plate 136. In the case where the B region B transmission circularly polarizing plate 136 having a spectral transmittance shown in FIG. 5 is used, the emission efficiency of B emitted light is about 1.25 times as large as that in the case where a circularly polarizing plate having a transmittance of about 40% in the entire visible range is used, whereby the emission efficiency of the display apparatus can be improved. Here, a value shown in FIG. 4 was used as a B emission spectrum.

Figure 7:
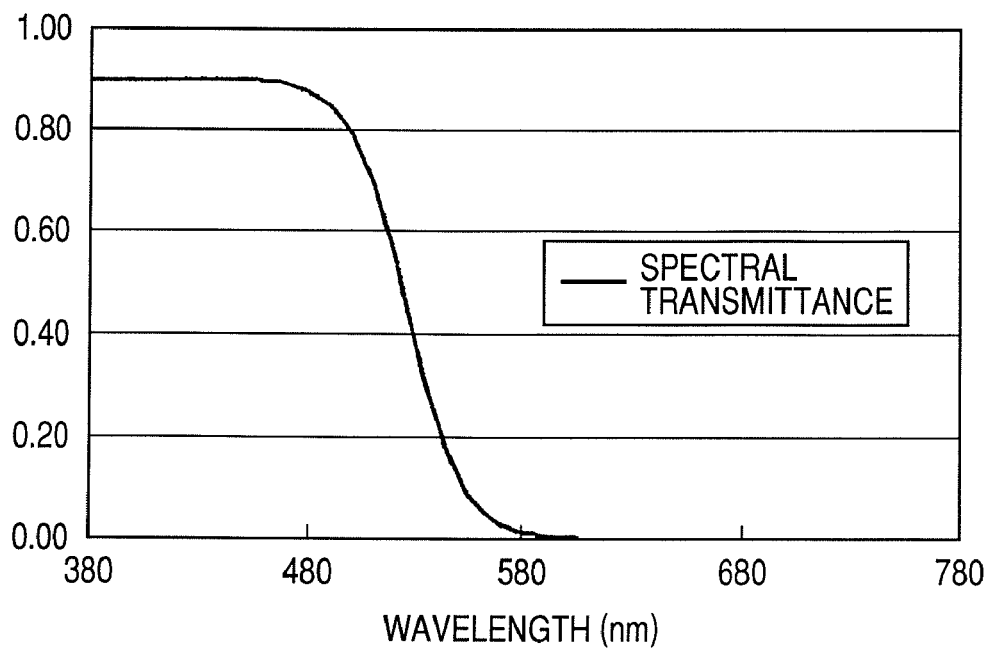
FIG. 7 is a graph exemplifying a spectral transmittance of a B complementary color absorption layer.

Next, as shown in FIG. 3, a B complementary color absorption layer (absorption layer) 137 is placed as a component β on the light extraction side of the B light emitting region. FIG. 7 shows an example of the spectral transmittance of the B complementary color absorption layer 137. In other words, the term "B complementary color absorption" refers to the absorption of light having a wavelength except a wavelength component in B emitted light.

Although in FIG. 3, the B complementary color absorption layer 137 is placed between the B region B transmission circularly polarizing plate 136 and an organic EL device, the position at which the layer is placed does not necessarily have to be the foregoing position. That is, the B complementary color absorption layer 137 may be placed closer to the light extraction side than the B region B transmission circularly polarizing plate 136 is.

In addition, the B complementary color absorption layer 137 is particularly needed when the B region B transmission circularly polarizing plate 136 has a high transmittance for not only a B color but also each of R and G colors in the B light emitting region.

Figure 8:
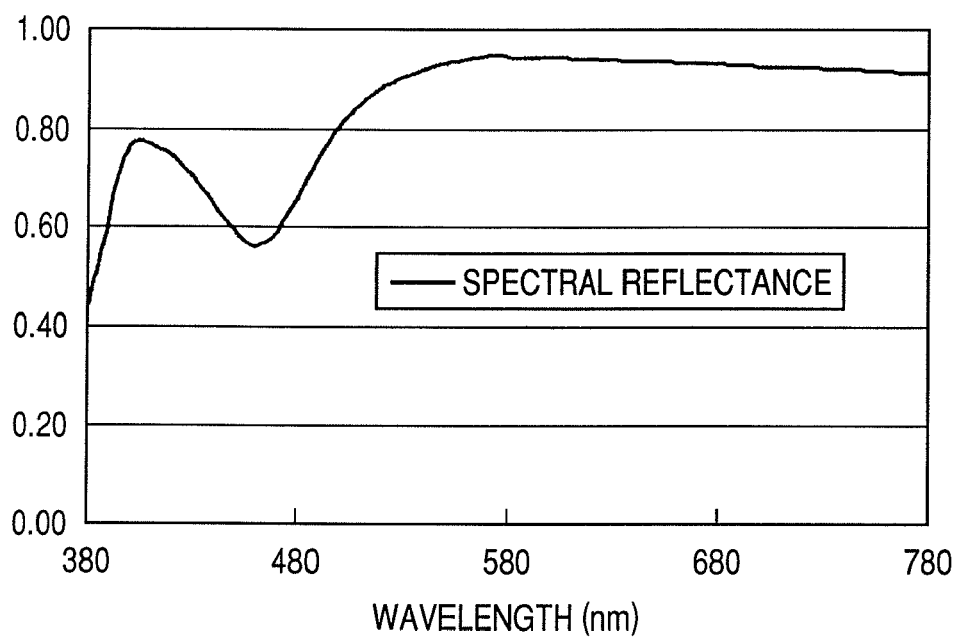
FIG. 8 is a graph exemplifying a spectral reflectance of a B multilayer interference film.

Finally, a multilayer interference film possessed by the B organic EL device is formed as a component γ so that its spectral reflectance takes a minimum value or a local minimum value in a B light emitting wavelength range. The term "multilayer interference film" refers to a structure having at least one pair of reflecting surfaces, and the structure is such that an optical distance between the at least one pair of reflecting surfaces is adjusted so that external light beams each in a predetermined wavelength range are caused to weaken each other, and the efficiency with which emitted light is extracted is improved. FIG. 8 shows the spectral reflectance of a multilayer interference film obtained by sequentially laminating an Ag alloy having a thickness of 200 nm, IZO having a thickness of 20 nm, an organic layer having a thickness of 80 nm, and IZO having a thickness of 60 nm on a glass substrate as a constitution example. In this case, a pair of reflecting surfaces is an interface between the Ag alloy and IZO, and the interface of IZO formed after the organic layer on a light extraction side. In addition, an optical distance between both the interfaces is set to satisfy a desired condition. To be specific, the local minimum value of the spectral reflectance is present around a wavelength of 460 nm in the wavelength range of a B emission spectrum shown in FIG. 4, that is, 420 nm to 550 nm, and the film is formed to have such a thickness that a reflectance for incident light in the B light emitting wavelength range is reduced.

Alternatively, the following constitution may be adopted: a semi-transparent electrode is used instead of the transparent electrode 103, a resonator structure having a resonant wavelength near the peak wavelength of the B emission spectrum is introduced, and the reflectance for incident light in the B light emitting wavelength range is additionally reduced. A metal semi-transparent electrode, a combination of a transparent electrode and a dielectric mirror, or the like can be used as the semi-transparent electrode.

In FIG. 3, a B transmitted light beam 332A in the B light emitting region cancels B reflected light beams 333A and 333B from the respective multilayer film interfaces of the multilayer interference film structure of the B organic EL device by interference, whereby the reflection of the B incident light beam 331 can be suppressed.

The foregoing three components can prevent the reflection of each of the R, G, and B components of incident light. An additionally high reducing effect on the reflection of external light can be expected from the presence of the component β or the component γ, but these components are not indispensable. That is, a constitution which is free of either the component β or the component γ or which has neither the component β nor the component γ is permitted.

In addition, a B low-reflection electrode (reflecting layer) made of, for example, Au or Cu may be used as the reflecting electrode 102 of an organic EL device of which an R or G sub-pixel showing a luminescent color except the first luminescent color is formed. In addition, a multilayer interference film formed of, for example, a metal and a transparent electrode and having reduced reflecting property in the B light emitting wavelength range can be used as the B low-reflection electrode (reflecting layer). The spectral reflectance of the B low-reflection electrode in the B light emitting wavelength range desirably takes a minimum value of less than 50%. Further, a black matrix can be placed in a region except the light emitting region of a sub-pixel (light emitting device), or can be placed between sub-pixels (light emitting devices).

Figure 9:
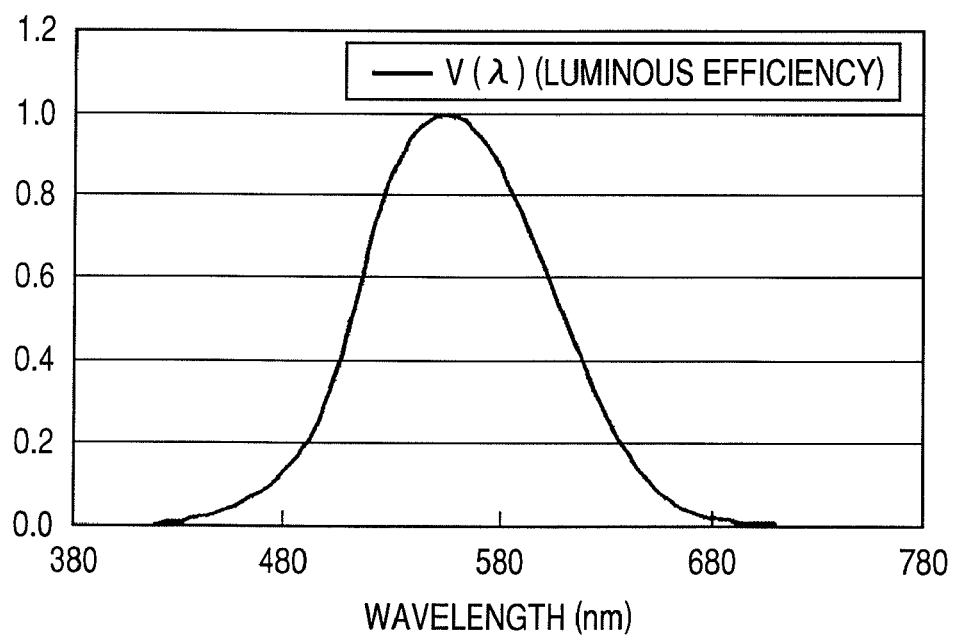
FIG. 9 is a graph showing luminous efficiency.
Figure 10:
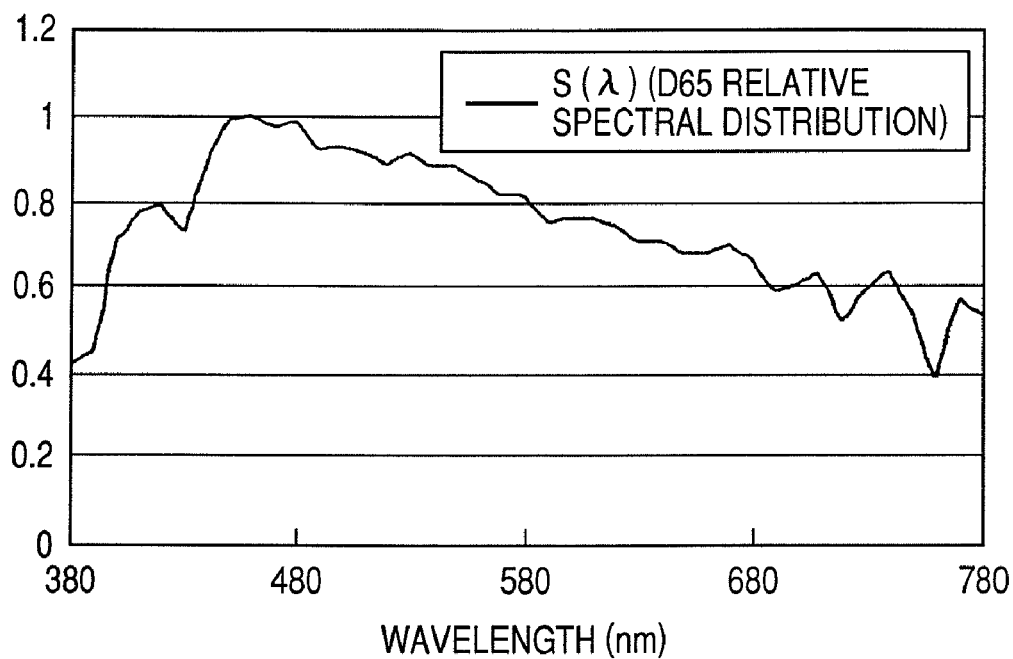
FIG. 10 is a graph showing a relative spectral distribution of a CIE daylight illuminant D65.
Figure 11:
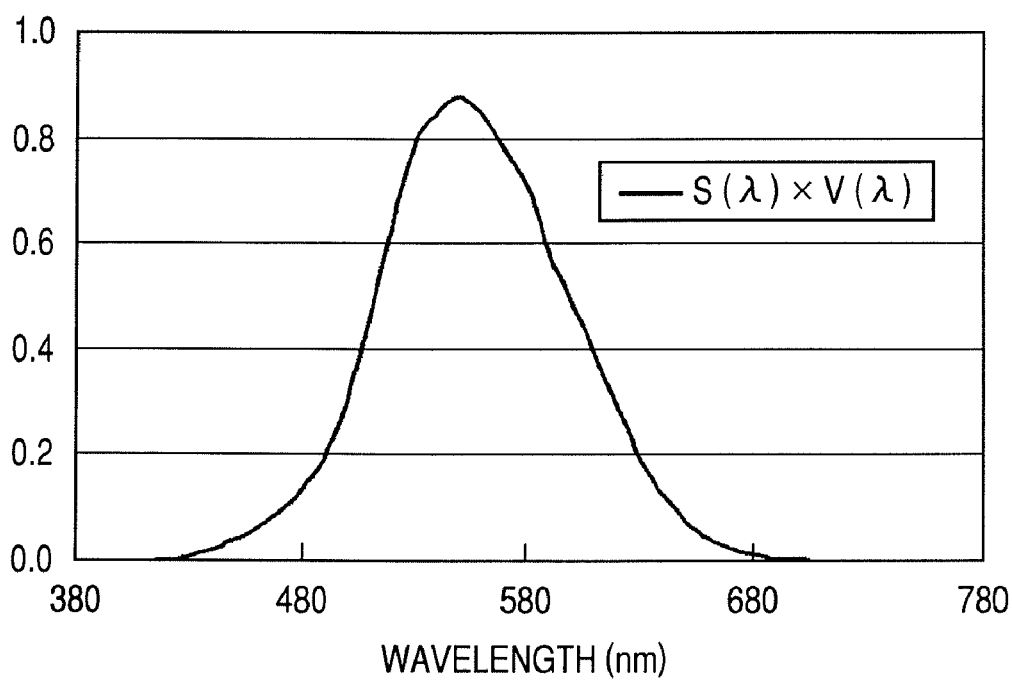
FIG. 11 is a graph showing a value obtained by multiplying the relative spectral distribution of the CIE daylight illuminant D65 by luminous efficiency.

A function of preventing the reflection of external light can be evaluated for performance on the basis of a luminous reflectance RV. The luminous reflectance RV can be defined by the following formula (1) by using a luminous efficiency $V(\lambda)$, a relative spectral distribution $S(\lambda)$ of illumination light, and a spectral reflectance $R(\lambda)$ of the display apparatus each of which varies depending on a wavelength $\lambda$. FIG. 9 shows the graph of the luminous efficiency $V(\lambda)$. The luminous efficiency shows a maximum at a wavelength of 555 nm. In the description of the present invention, the D65 relative spectral distribution of a CIE daylight illuminant shown in FIG. 10 is used as the relative spectral distribution $S(\lambda)$ of illumination light. FIG. 11 shows a value obtained by multiplying the D65 relative spectral distribution by the luminous efficiency $(S(\lambda) \times V(\lambda))$.

$$RV = \frac{\int_{380}^{780} d\lambda V(\lambda) R(\lambda) S(\lambda)}{\int_{380}^{780} d\lambda V(\lambda) S(\lambda)} \tag{1}$$

Table 1 shows a value obtained by evaluating each of the following three constitutions for luminous reflectance: (Constitution 1) the B region B transmission circularly polarizing plate 136, (Constitution 2) the B region B transmission circularly polarizing plate 136+the B complementary color absorption layer 137, and (Constitution 3) the B region B transmission circularly polarizing plate 136+the B complementary color absorption layer 137+a B interference film.

Figure 12:
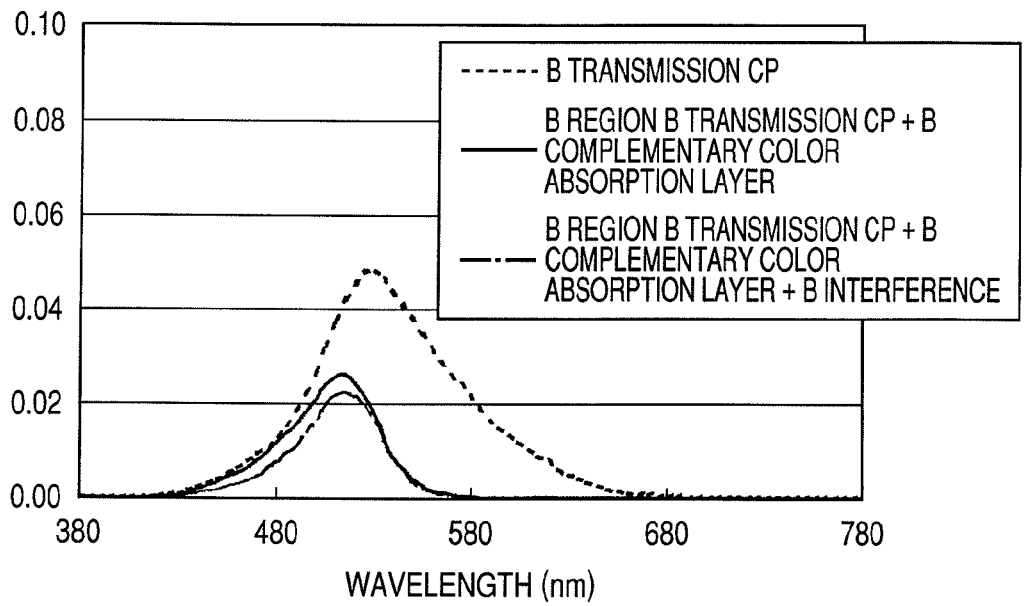
FIG. 12 is a graph showing a luminous reflection distribution in Constitution 1, Constitution 2, or Constitution 3 of the display apparatus according to the present invention.

Here, the evaluation was performed with an opening ratio set to 50%. In addition, FIG. 12 shows a luminous reflection distribution defined by the following formula (2) in each constitution.

Luminous reflection distribution=spectral reflectance $R(\lambda) \times$ D65 relative spectral distribution $S(\lambda) \times$ luminous efficiency $V(\lambda)$ (2)

TABLE 1

| Display apparatus constitution | B region B transmission circularly polarizing plate | B complementary color absorption layer | B interference film | Luminous reflectance |
|---|---|---|---|---|
| Constitution 1 | Present | Absent | Absent | 4.85% |
| Constitution 2 | Present | Present | Absent | 1.71% |
| Constitution 3 | Present | Present | Present | 1.37% |

The luminous reflectance is reduced to 5% or less in any one of the constitutions. In particular, the luminous reflectance is reduced to 2% or less in each of Constitution 2 and Constitution 3 in each of which the B complementary color absorption layer 137 is added.

An improvement in transmittance of the B region B transmission circularly polarizing plate 136 for the luminescent color having the lowest emission efficiency (B in this embodiment) is effective in reducing the power consumption of the entire display apparatus. Hereinafter, a conventional external light reflection preventing constitution in which a circularly polarizing plate having a transmittance of 40% in the entire visible range is placed on the light extraction side of the display apparatus is defined as Conventional Constitution 1, and the power consumption of Conventional Constitution 1 is compared with that of Constitution 3. In each of Conventional Constitution 1 and Constitution 3, R, G, and B organic EL devices of which sub-pixels are formed have emission spectra shown in FIG. 4, and the R organic EL device has an emission efficiency of 21.6 (cd/A), the G organic EL device has an emission efficiency of 19.8 (cd/A), and the B organic EL device has an emission efficiency of 2.3 (cd/A). In addition, the display apparatus has an opening ratio of 50%, and is driven at a voltage of 10 V. Values upon display of a white color W having a color temperature of 6,500 K at 100 cd/m$^2$ are used for a luminance ratio, a driving current density, and a power consumption showing the characteristics of the entire display apparatus.

Table 2 shows values for the CIE chromaticity, emission efficiency, luminance ratio, driving current density, and power consumption of Conventional Constitution 1. Of the R, G, and B sub-pixels, the B sub-pixel has an emission efficiency of 0.92 (cd/A), which is the worst value, and, at the same time, the B sub-pixel is driven at a current density of 8.9 (mA/cm$^2$), which is the largest value.

Figure 13:
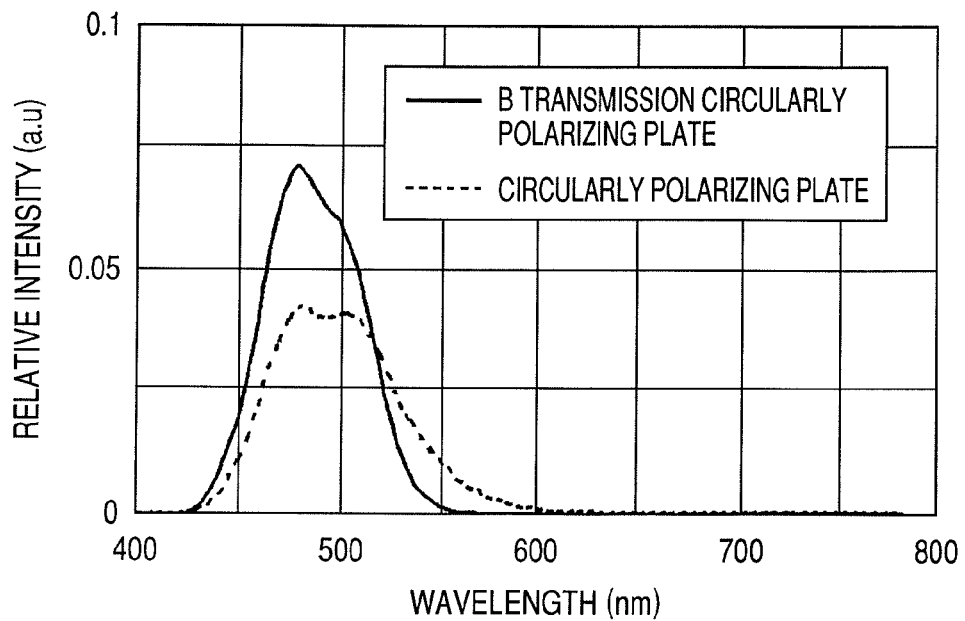
FIG. 13 is a view showing a comparison between a B emission spectrum when the B region B transmission circularly polarizing plate is used and a B emission spectrum when a circularly polarizing plate is used.

Table 3 shows values for the CIE chromaticity, emission efficiency, luminance ratio, driving current density, and power consumption of Constitution 3. In addition, FIG. 13 shows the B emission spectrum of Constitution 3 (solid line) and the B emission spectrum of Constitution 1 (dashed line). The use of the B region B transmission circularly polarizing plate 136 can improve the emission efficiency of the B sub-pixel by a factor of about 1.25, and, at the same time, can improve the chromaticity, and reduce the luminance ratio, of the B sub-pixel. Accordingly, the power consumption of the display apparatus can be reduced from 682.7 mW to 523.8 mW, that is, by about 20%. In addition, the current density at which the B sub-pixel is driven is significantly reduced from 8.9 (mA/cm$^2$) to 5.1 (mA/cm$^2$), whereby a difference in driving current density between any two of the R, G, and B sub-pixels is alleviated.

Further, in many organic EL devices, the half lifetime of the luminance of each of the devices lengthens in association with a reduction in current density at which the device is driven. Accordingly, when the half lifetime of a B organic EL device is shortest, the half lifetime of the B organic EL device is improved in association with a reduction in current density at which the B organic EL device is driven, whereby a difference in half lifetime between any two of the R, G, and B sub-pixels can be adjusted. Here, description has been given on the basis of Constitution 3. In addition, the same holds true for each of Constitution 1 and Constitution 2.

TABLE 2

| | | | @ 100 cd/m$^2$, W(0.32, 0.33) | | | |
|---|---|---|---|---|---|---|
| Pixel | CIE x | CIE y | Emission efficiency (cd/A) | Luminance ratio | Driving current density (mA/cm$^2$) | Power consumption (mW) |
| R | 0.650 | 0.348 | 8.6 | 29.4% | 2.0 | 682.7 |
| G | 0.280 | 0.665 | 7.92 | 56.9% | 4.3 | |
| B | 0.136 | 0.103 | 0.92 | 13.7% | 8.9 | |

TABLE 3

| | | | @ 100 cd/m$^2$, W(0.32, 0.33) | | | |
|---|---|---|---|---|---|---|
| pixel | CIE x | CIE y | Emission efficiency (cd/A) | Luminance ratio | Driving current density (mA/cm$^2$) | Power consumption (mW) |
| R | 0.651 | 0.349 | 8.6 | 29.0% | 2.0 | 523.8 |
| G | 0.290 | 0.670 | 7.92 | 61.1% | 4.6 | |
| B | 0.133 | 0.077 | 1.16 | 9.8% | 5.1 | |

An organic compound, to be used in each of the hole transporting layer 106, the light emitting layer 105, the electron transporting layer 107, the hole injecting layer 108, and the electron injecting layer 109 in FIG. 2 is formed of one or both of a low weight molecule material and a polymer material, and is not particularly limited. Further, an inorganic compound may be used as required.

Hereinafter, examples of the compound are given.

A desired hole transporting material has excellent mobility for facilitating injection of a hole from an anode and for transporting the injected hole to a light emitting layer. Examples of a low molecular weight or polymer material having hole-injection transporting property include, but of course are not limited to: a triarylamine derivative; a phenylenediamine derivative; a triazole derivative; an oxadiazole derivative; an imidazole derivative; a pyrazoline derivative; a pyrazolone derivative; an oxazole derivative; a fluorenone derivative; a hydrazone derivative; a stilbene derivative; a phthalocyanine derivative; a porphyrin derivative; poly(vinylcarbazole); poly(silylene); poly(thiophene); and other conductive polymers. Part of specific examples of the material is shown below.

Low Molecular Weight Hole-Injection Transporting Material

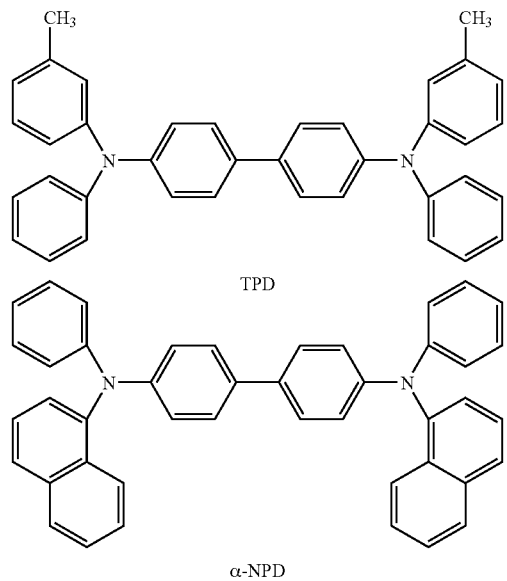

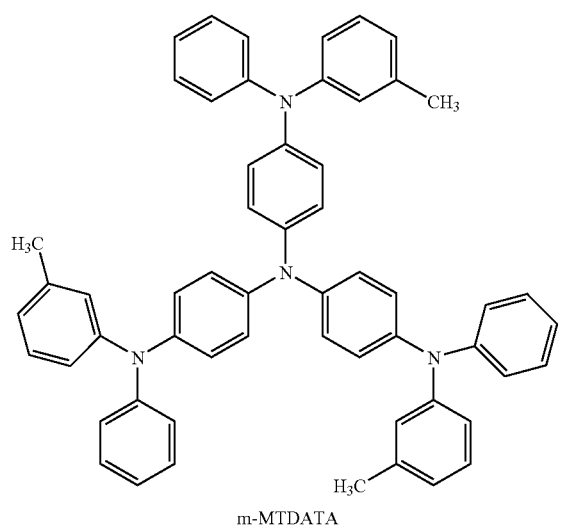
m-MTDATA
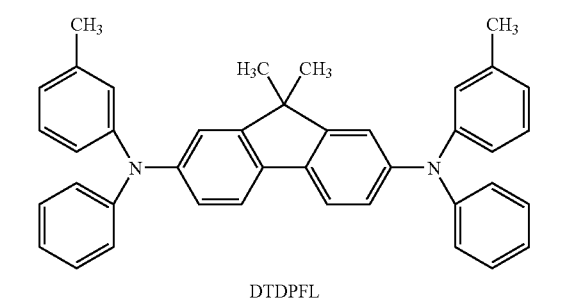
DTDPFL
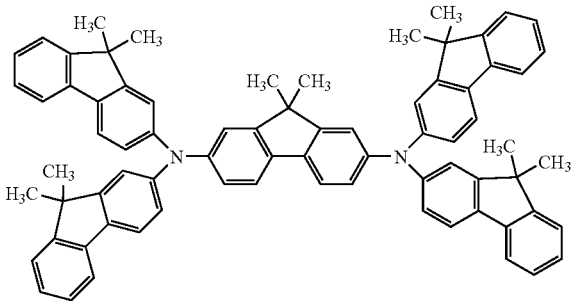
TFLFL
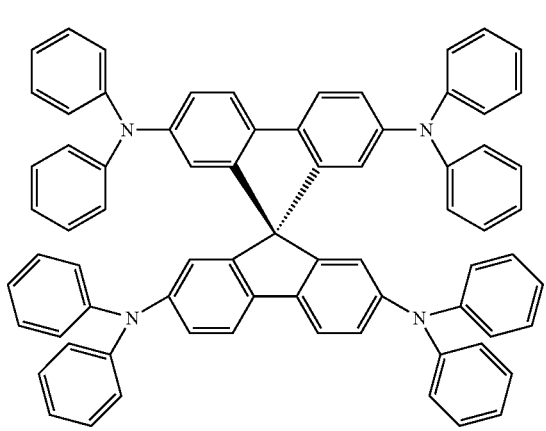
spiro-TPD
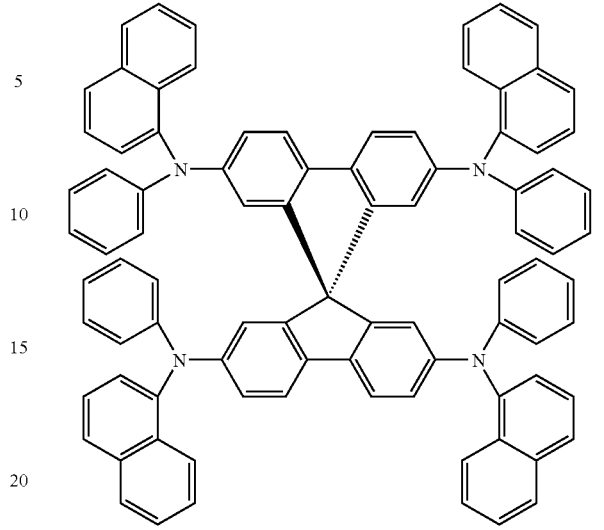
spiro-NPD
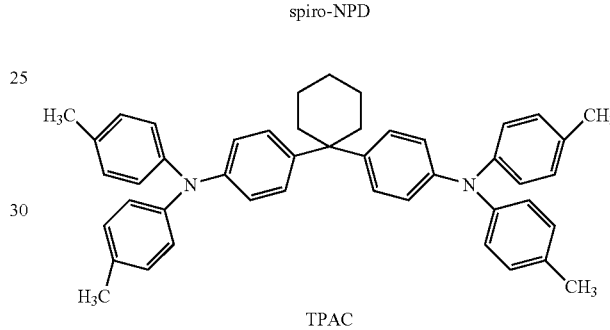
TPAC
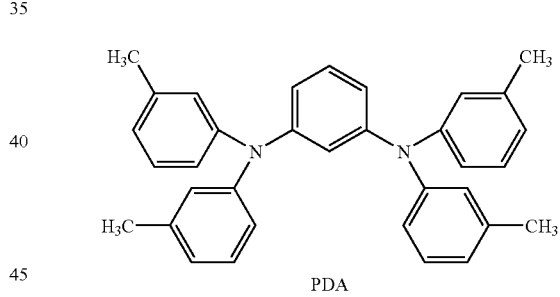
PDA
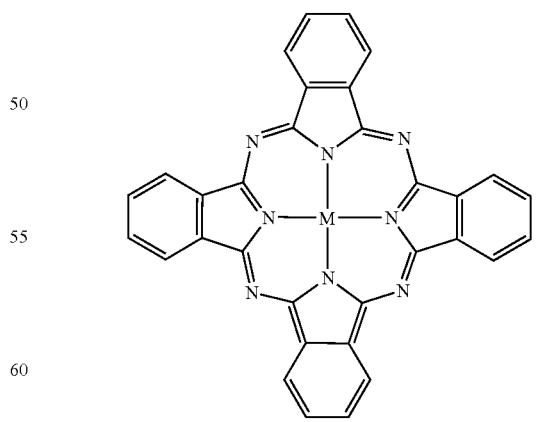
Pc-M
M: Cu, Mg, AlCl, TiO,
SiCl2, Zn, Sn, MnCl, GaCl,
etc Polymer Hole Transporting Material
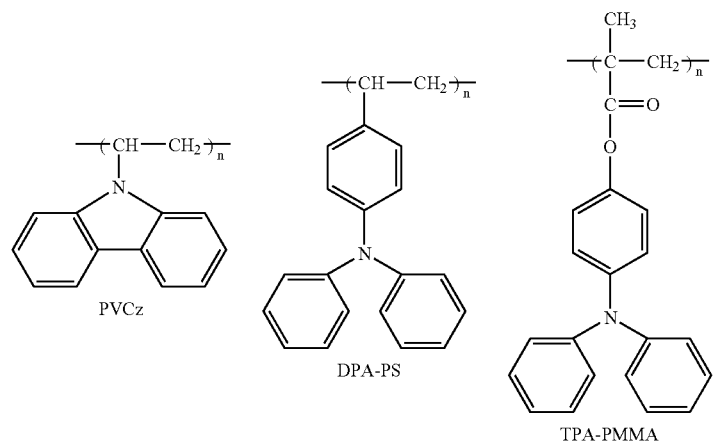
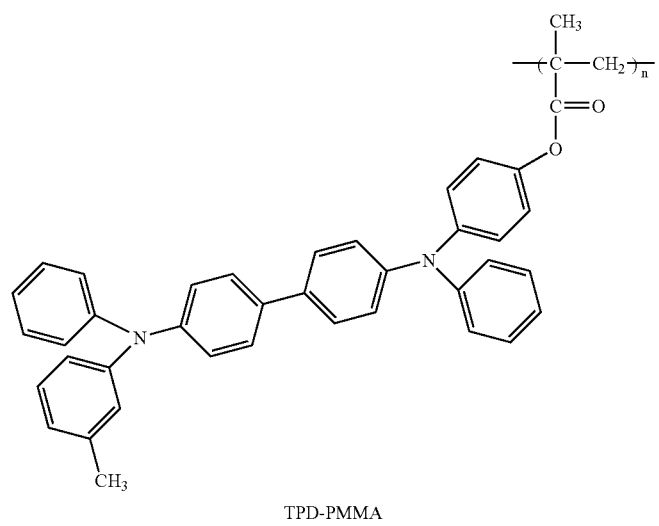
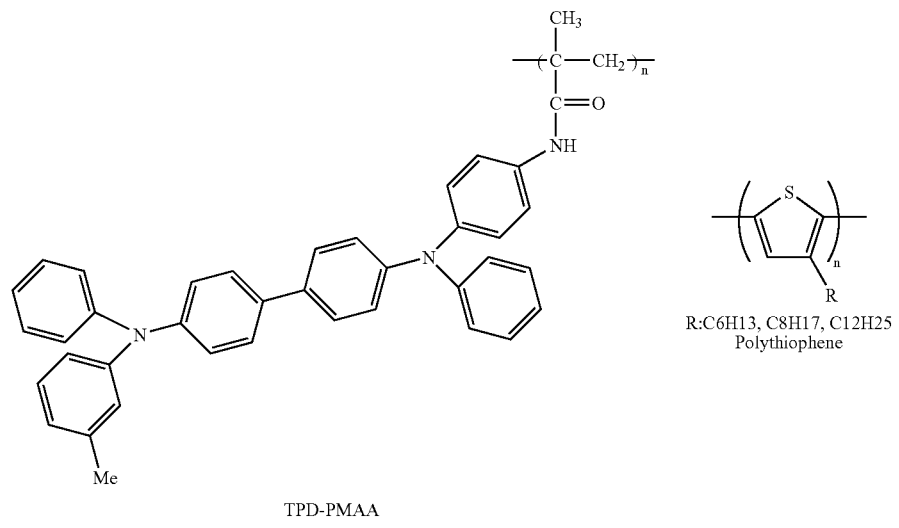

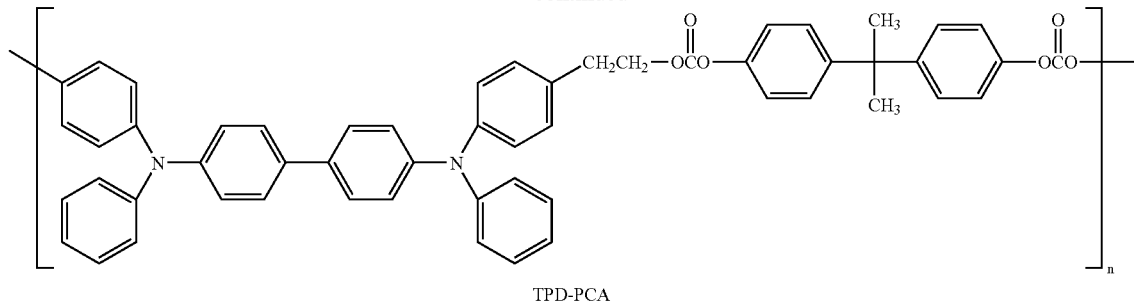

TPD-PCA

A fluorescent dye or phosphorescent material having high emission efficiency is used as a light emitting material. Part of specific examples of the light emitting material is shown below.

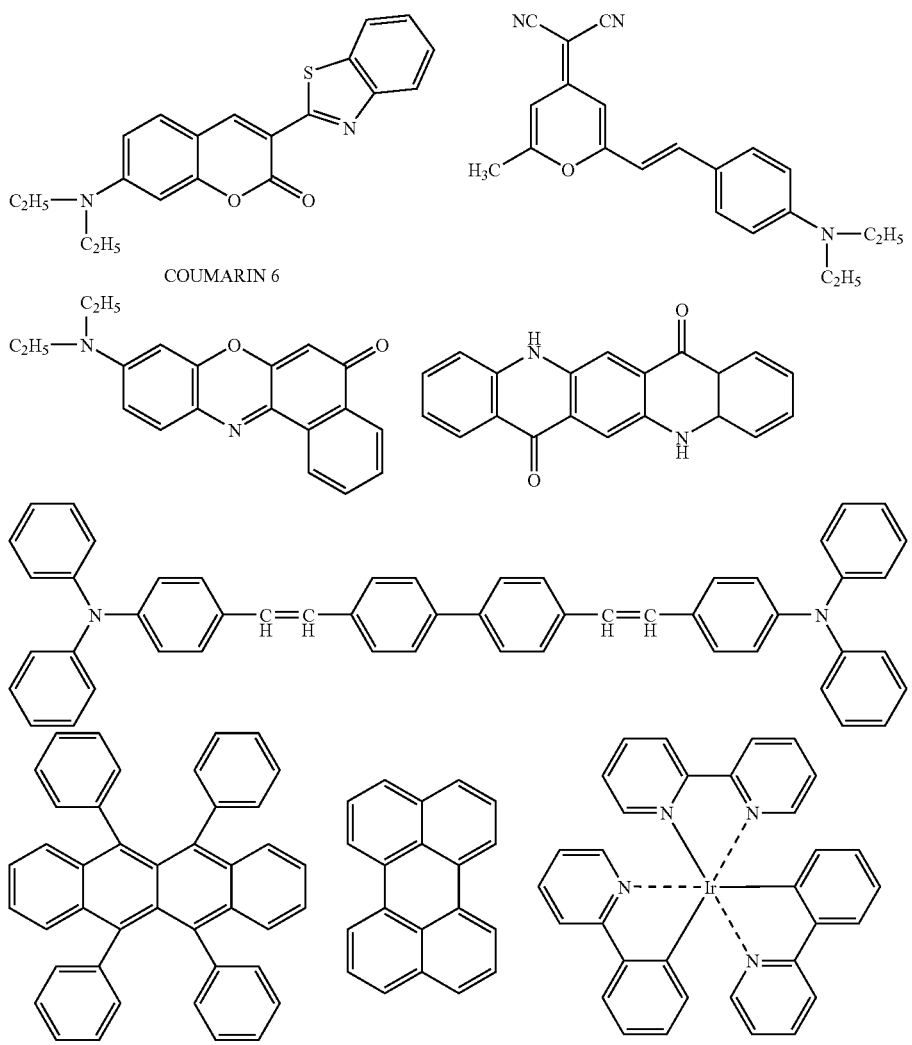

COUMARIN 6

The electron transporting material may be arbitrarily selected from materials which transports the injected electron into the light emitting layer. The material is selected in consideration of, for example, the balance with the mobility of a carrier of the hole transporting material. Examples of a material having electron-injection transporting property include, but of course are not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex. Part of specific examples of the material is shown below.

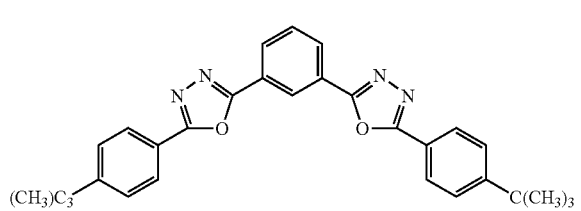

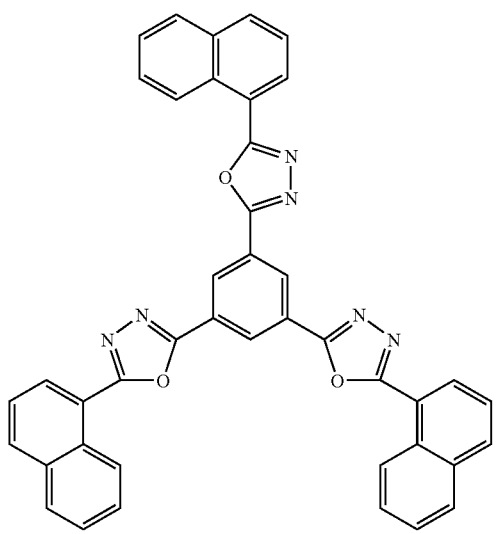

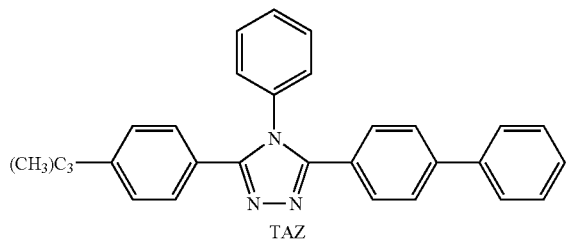

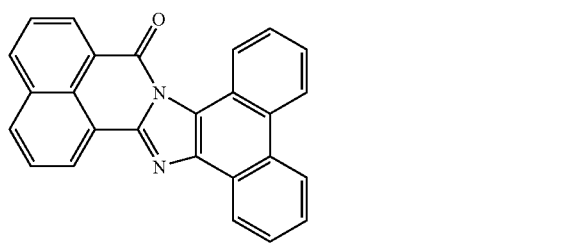

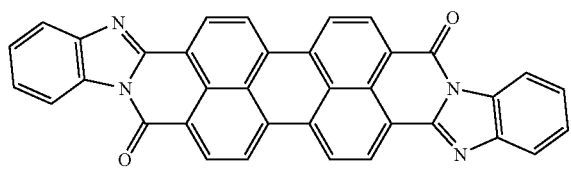

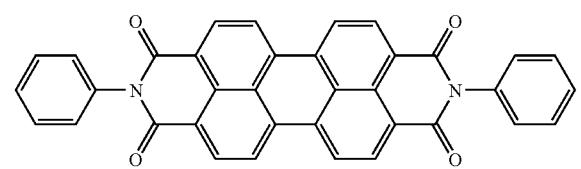

-continued

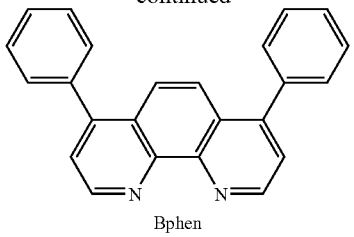

Bphen

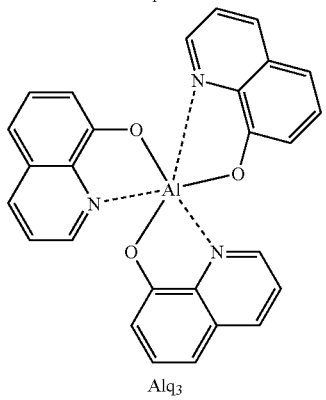

Alq₃

Examples of a hole injecting material include: transition metal oxides such as $MoO_3$, $WO_3$, and $V_2O_5$; and copper phthalocyanine Cupc.

Further, any one of the above-mentioned electron transporting materials is caused to contain 0.1 percent to several tens of percent of an alkali metal or an alkaline earth metal, or a compound of any such metal, whereby electron injecting-property can be imparted to the material, and the material can serve as an electron injecting material. An electron injecting layer 109 is not an indispensable layer, but, in consideration of damage caused at a time of film formation upon subsequent formation of the transparent electrode 103, an electron injecting layer having a thickness of about 10 to 100 nm is desirably inserted in order that good electron injecting property may be secured.

In a layer made of the organic compound layer of the present invention, a thin film is generally formed by a vacuum deposition method, an ionized deposition method, sputtering, plasma, or a known coating method (such as a spin coating, dipping, casting, LB, or inkjet method) in which a compound is dissolved in an appropriate solvent. In film formation by a coating method, in particular, a film may be formed by using a compound in combination with an appropriate binder resin.

The above-mentioned binder resin may be selected from a wide variety of binder resins. Examples of the binder resin include, but of course not limited to: a polyvinyl carbazole resin; a polycarbonate resin; a polyester resin; a polyallylate resin; a polystyrene resin; an ABS resin; a polybutadiene resin; a polyurethane resin; an acrylic resin; a methacrylic resin; a butyral resin; a polyvinyl acetal resin; a polyamide resin; a polyimide resin; a polyethylene resin; a polyethersulfone resin; a diallyl phthalate resin; a phenol resin; an epoxy resin; a silicone resin; a polysulfone resin; and a urea resin. One kind of binder resin may be used alone, or two or more kinds thereof may be mixed and used as a copolymer. Further, an additive such as a known plasticizer, antioxidant, or ultraviolet absorber may be used in combination as required.

The above-mentioned oxide conductive film made of, for example, ITO or IZO can be used as the transparent electrode 103. The combination of the electron transporting layer 107 and the electron injecting layer 109 is desirably selected in such a proper manner that good electron injecting property is obtained. In addition, the transparent electrode 103 can be formed by sputtering.

The protective layer is provided for the purpose of preventing each organic light emitting element from contacting with, for example, oxygen or moisture. Examples of the protective layer include: a metal nitride film made of, for example, silicon nitride or silicon oxynitride; a metal oxide film made of, for example, tantalum oxide; and a diamond thin film. In addition, the examples include: a polymer film made of, for example, a fluorine resin, poly(p-xylene), polyethylene, a silicone resin, or a polystyrene resin; and a photocurable resin. In addition, each element itself can be covered with, for example, glass, a gas impermeable film, or a metal, and packaged with a proper sealing resin. In addition, a moisture absorbent may be incorporated into the protective layer for improving the moisture resistance of the layer.

Embodiment 2

A display apparatus according to this embodiment has a plurality of pixels each having a plurality of light emitting devices showing different luminescent colors. In addition, the display apparatus has a circularly polarizing member on the light extraction side of each of the light emitting devices.

In addition, the circularly polarizing member is placed on a light emitting device showing a luminescent color except a first luminescent color out of the plurality of luminescent colors except a light emitting device showing the first luminescent color. Light emitted from the light emitting device showing the first luminescent color can be efficiently extracted to the outside of the device because no circularly polarizing member is placed in the light emitting device. Further, the circularly polarizing member is placed in the light emitting device showing a luminescent color except the first luminescent color, so the reflection of external light in a wide wavelength range can be sufficiently prevented.

Figure 14:
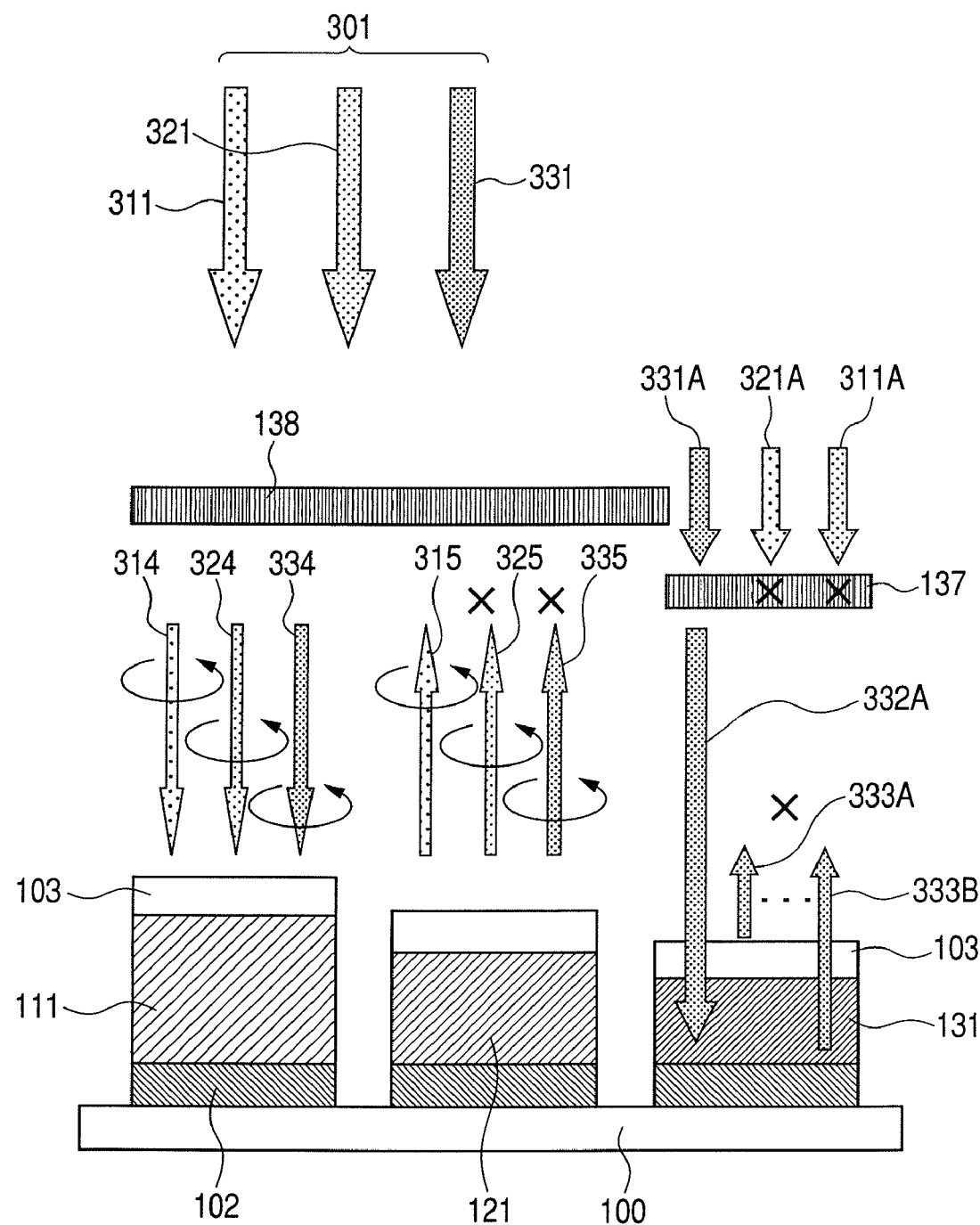
FIG. 14 is another view showing a constitution of a pixel of which the display apparatus according to the present invention is formed.

FIG. 14 shows another embodiment of the display apparatus according to the present invention. A display apparatus shown in FIG. 14 has a circularly polarizing plate (having no B light emitting region) 138 obtained by removing a B light emitting region portion from an ordinary circularly polarizing plate, the plate 138 being placed as the component α instead of the B region B transmission circularly polarizing plate 136 shown in FIG. 3. The B complementary color absorption layer 137 as the component β and a B multilayer interference film structure as the component γ are placed in the same manner as in Embodiment 1. The resultant constitution is defined as Constitution 4. The constitution has a luminous reflectance of 1.20%, so the contrast of the display apparatus can be improved. In addition, the constitution has a power consumption of 491.3 mW, which is reduced from the power consumption of Conventional Constitution 1, that is, 682.7 mW by about 30%.

In addition, the B complementary color absorption layer 137 and the B multilayer interference film structure may be omitted as required.

Embodiments 1 and 2 above have been described on the basis of a constitution in which an anode is placed on a substrate side and a cathode is placed on a light extraction side. However, the present invention can be carried out even in a constitution in which a cathode is placed on a substrate side, an anode is placed on a light extraction side, and a hole transporting layer, a light emitting layer, and an electron transporting layer are laminated in the order reverse to that described above, and a constitution in which the present invention can be carried out is not particularly limited.

Moreover, the present invention can be carried out in a bottom emission type in which a transparent electrode is formed on a transparent substrate, and an organic layer and a reflective electrode are laminated on the electrode.

In addition, the area of a sub-pixel, more specifically, the area of the light emitting region of the sub-pixel may be identical to or different from that of any other sub-pixel.

Further, the present invention can be carried out in a multiphoton constitution or multistage laminated constitution in which a plurality of organic EL devices are laminated.

Embodiments 1 and 2 above have been described on the basis of a constitution including sub-pixels for three colors, that is, R, G, and B colors. However, the present invention can be carried out even in any other sub-pixel constitution such as a constitution including sub-pixels for four colors, that is, R, G, B, and cyan (C) colors or a constitution including a sub-pixel for a single color, that is, a B color, and a constitution in which the present invention can be carried out is not particularly limited.

Description has been given on the basis of a constitution for improving the emission efficiency of a B pixel. However, the present invention can be carried out even in a pixel having any other luminescent color.

The present invention is not limited to a display apparatus using an organic EL device, and can be carried out in, for example, a light emitting display apparatus using an inorganic EL device, a quantum dot EL device, or an inorganic light emitting diode, or a plasma display.

Example 1

Hereinafter, examples of the present invention will be described. However, the present invention is by no means limited by the examples.

A full-color organic EL display apparatus having a constitution shown in FIG. 3 is produced by a method shown below.

First, a TFT driver circuit formed of low-temperature polysilicon is formed on a glass substrate as a support, and a planarization film formed of an acrylic resin is formed on the circuit, whereby a substrate is obtained. An Ag alloy (AgPdCu) as a reflective metal is formed into a film having a thickness of about 100 nm by a sputtering method and patterned on the substrate, and IZO as a transparent conductive film is formed into a film having a thickness of 20 nm by the sputtering method and patterned on the substrate, whereby the reflecting electrode 102 is formed. Further, a device separating film is formed of an acrylic resin, whereby a substrate with an anode is produced. The resultant is subjected to ultrasonic cleaning with isopropyl alcohol (IPA). Next, the resultant is subjected to boil washing and dried. After that, the resultant is subjected to UV/ozone cleaning before an organic compound is formed into a film by vacuum deposition.

Compound (I) represented by the following structural formula is formed into a film to serve as a hole transporting layer on the resultant. A hole transporting layer for an R color having a thickness of 50 nm, a hole transporting layer for a G color having a thickness of 30 nm, and a hole transporting layer for a B color having a thickness of 20 nm are each formed with a shadow mask. Each layer is formed at a degree of vacuum of $1\times10^{-4}$ Pa and a deposition rate of 0.2 nm/sec.

Compound (I)

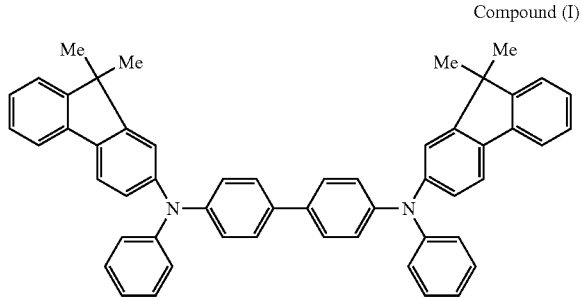

Next, a light emitting layer for each of R, G, and B colors is formed with a shadow mask. Alq3 as a host and a luminous compound DCM [4-(dicyanomethylene)-2-methyl-6(p-dim-ethylaminostyryl)-4H-pyran] are co-deposited from the vapor (at a weight ratio of 99:1), whereby a light emitting layer having a thickness of 60 nm is formed as a light emitting layer for an R color. Alq3 as a host and a luminous compound coumarin 6 are co-deposited from the vapor (at a weight ratio of 99:1), whereby a light emitting layer having a thickness of 40 nm is formed as a light emitting layer for a G color. Compound (II) shown below as a host and Compound (III) shown below as a luminous compound are co-deposited from the vapor (at a weight ratio of 80:20), whereby a light emitting layer having a thickness of 20 nm is formed as a light emitting layer for a B color. Each layer is formed at a degree of vacuum at the time of the vapor deposition of $1 \times 10^{-4}$ Pa and a film formation rate of 0.2 nm/sec.

Compound (II)

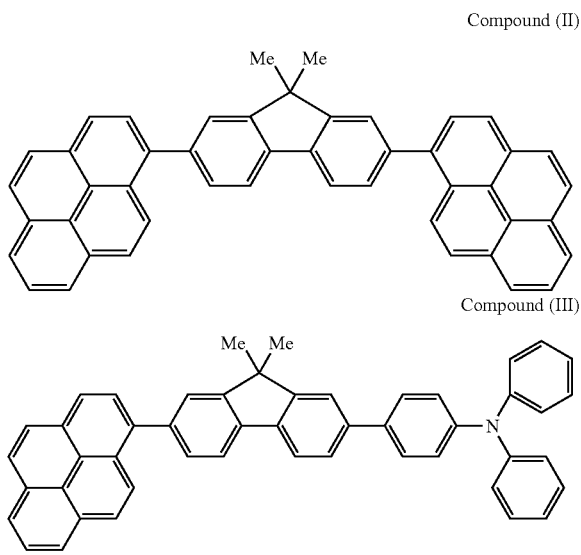

Compound (III)

Further, Bathophenathroline (Bphen) is formed into a film having a thickness of 10 nm by the vacuum deposition method, which serves as the common electron transporting layer. The layer is formed at a degree of vacuum at the time of the vapor deposition of $1 \times 10^{-4}$ Pa and a film formation rate of 0.2 nm/sec. Then, Bphen and $Cs_2CO_3$ are co-deposited from the vapor (at a weight ratio of 90:10), whereby a common electron injecting layer having a thickness of 20 nm is formed. The layer is formed at the degree of vacuum at the time of the vapor deposition of $3 \times 10^{-4}$ Pa and a deposition rate of 0.2 nm/sec.

The substrate after the formation of the electron injecting layer is transferred to a sputtering apparatus while a degree of vacuum is maintained. A transparent electrode made of ITO having a thickness of 60 nm is formed to serve as the transparent cathode 103. Further, silicon oxynitride is formed into a film having a thickness of 700 nm to serve as a protective film.

After that, a B color filter using a blue pigment patterned onto a B light emitting region on another glass substrate is placed as the B complementary color absorption layer 137 on an upper portion of the protective film with an epoxy resin.

Finally, the B region B transmission circularly polarizing plate 136 is placed on an upper portion of the B color filter with an adhesive, whereby a display apparatus is obtained.

Example 2

A display apparatus of this example is such that the circularly polarizing member shows a higher transmittance for a second luminescent color different from the first luminescent color out of the plurality of luminescent colors in a light emitting device showing the second luminescent color than a transmittance for any other color. In addition, a transmittance for the second luminescent color in a light emitting device showing any other luminescent color is lower than the transmittance for the second luminescent color in the light emitting device showing the second luminescent color. The transmittance for the second luminescent color in the light emitting device showing the second luminescent color is higher than the transmittance for any other color, whereby light emitted from the light emitting device showing the second luminescent color can be efficiently extracted to the outside of the device in the same manner as in the light emitting device showing the first luminescent color. Further, a transmittance for the second luminescent color in a light emitting device showing any other luminescent color is lower than the transmittance for the second luminescent color in the light emitting device showing the second luminescent color. With such constitution, the reflection of external light in the same wavelength range as that of each of the first luminescent color and the second luminescent color can be sufficiently prevented in a light emitting device showing a luminescent color except the first luminescent color and the second luminescent color.

Figure 15:
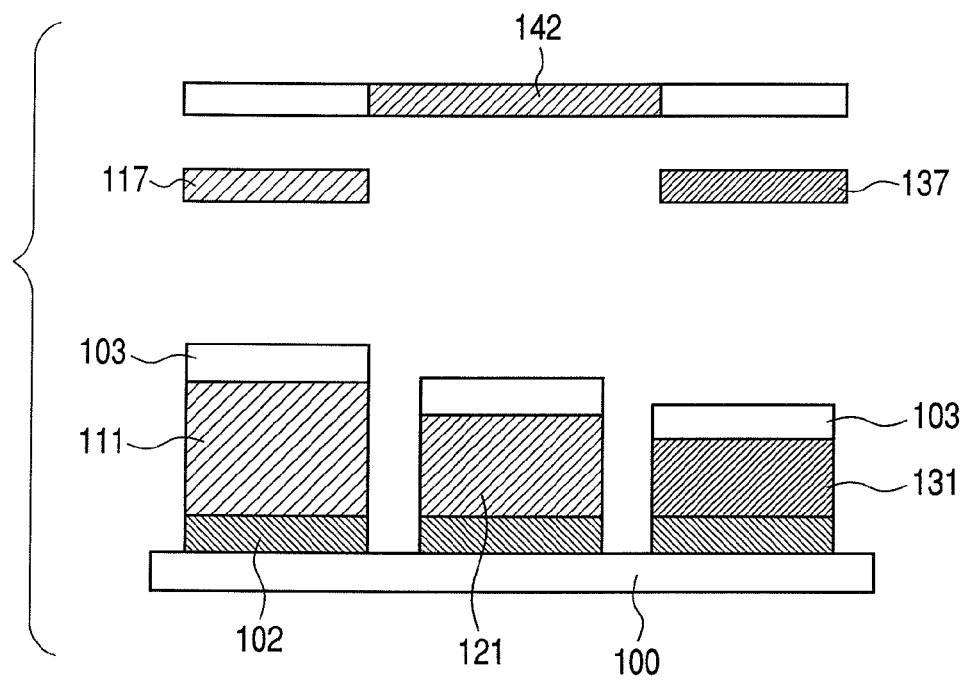
FIG. 15 is a constitution view when an R emission efficiency of a pixel of which the display apparatus according to the present invention is formed is improved.

FIG. 15 shows a view of the constitution of the organic EL light emitting apparatus of Example 2. A procedure before the formation of a hole transporting layer is the same as that of Example 1. Reference numeral 117 represents an R complementary color absorption layer; 137, the B complementary color absorption layer; and 142, an RB region transmission circularly polarizing plate.

Compound (I) is formed into a film to serve as a hole transporting layer on the resultant. A hole transporting layer for an R color having a thickness of 160 nm, a hole transporting layer for a G color having a thickness of 130 nm, and a hole transporting layer for a B color having a thickness of 70 nm are formed on each of the sub-pixels with a shadow mask. Each layer is formed at a degree of vacuum of $1 \times 10^{-4}$ Pa and a deposition rate of 0.2 nm/sec.

Next, a light emitting layer for each of R, G, and B colors is formed with a shadow mask. Alq3 as a host and a luminous compound DCM [4-(dicyanomethylene)-2-methyl-6(p-dim-ethylaminostyryl)-4H-pyran] are co-deposited from the vapor (at a weight ratio of 99:1), whereby a light emitting layer having a thickness of 50 nm is provided as a light emitting layer for an R color. Alq3 as a host and a luminous compound coumarin 6 are co-deposited from the vapor (at a weight ratio of 99:1), whereby a light emitting layer having a thickness of 40 nm is provided as a light emitting layer for a G color. Compound (II) as a host and Compound (III) as a luminous compound are co-deposited from the vapor (at a weight ratio of 80:20), whereby a light emitting layer having a thickness of 35 nm is provided as a light emitting layer for a B color. Each layer is formed at a degree of vacuum at the time of the vapor deposition of $1\times10^{-4}$ Pa and a film formation rate of 0.2 nm/sec.

Further, Bathophenathroline (Bphen) is formed into a film having a thickness of 10 nm by the vacuum deposition method, which serves as the common electron transporting layer. The layer is formed at a degree of vacuum at the time of the vapor deposition of $1\times10^{-4}$ Pa and a film formation rate of 0.2 nm/sec. Then, Bphen and $Cs_2CO_3$ are co-deposited from the vapor (at a weight ratio of 90:10), whereby a common electron injecting layer having a thickness of 30 nm is formed. The layer is formed at the degree of vacuum at the time of the vapor deposition of $3\times10^{-4}$ Pa and a deposition rate of 0.2 nm/sec.

The substrate after the formation of the electron injecting layer is transferred to a sputtering apparatus while a degree of vacuum is maintained. A transparent electrode made of ITO having a thickness of 60 nm is formed to serve as the transparent cathode 103.

Figure 17:
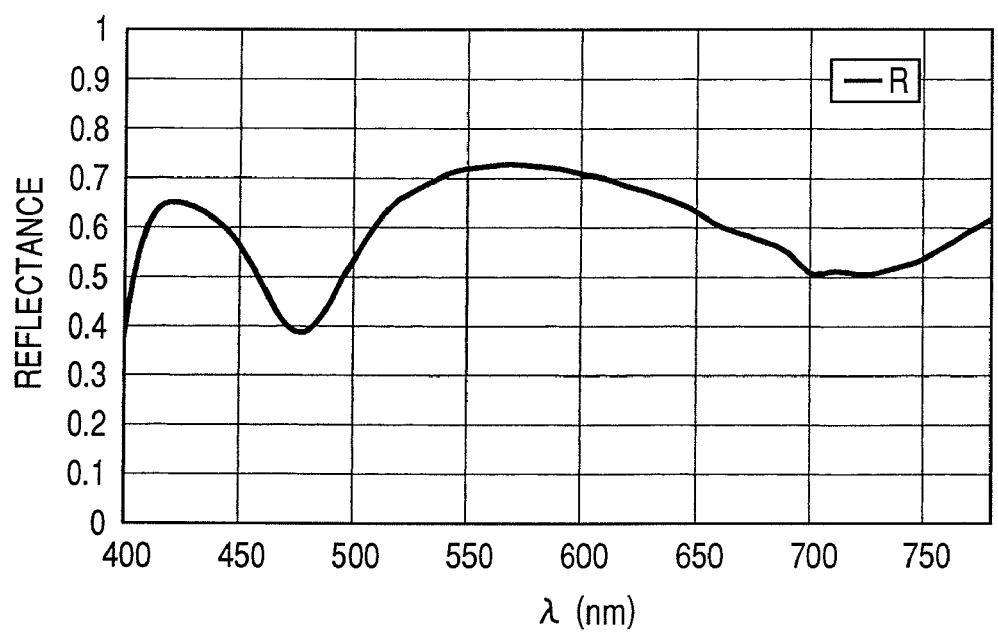
FIG. 17 is a graph exemplifying a spectral reflectance of a B resonator.
Figure 18:
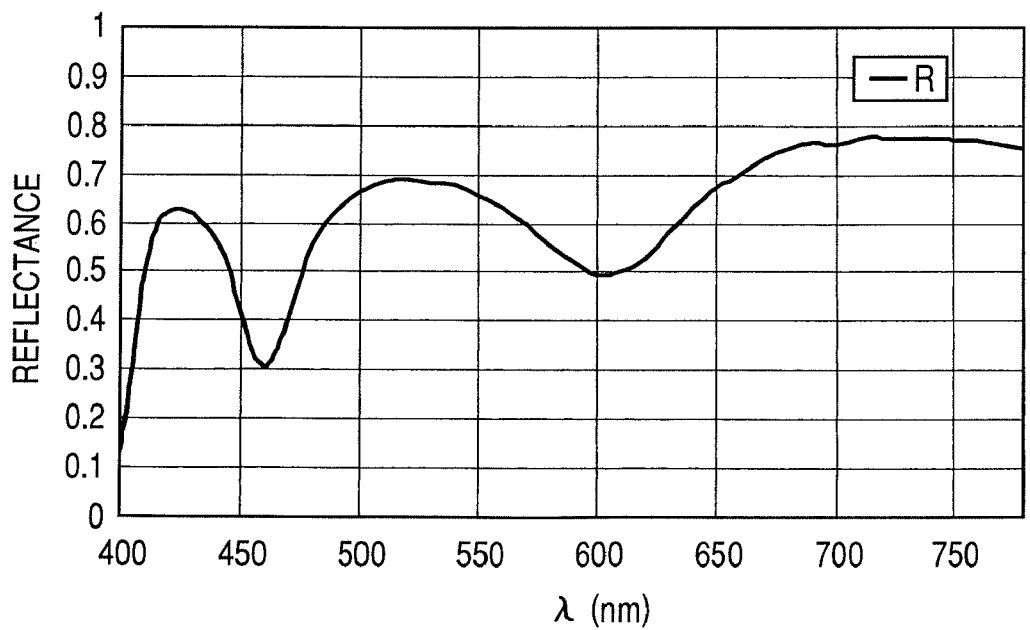
FIG. 18 is a graph exemplifying a spectral reflectance of an R resonator.

FIG. 17 shows the spectral reflectance of a B organic EL device formed as described above, and FIG. 18 shows the spectral reflectance of an R organic EL device formed as described above.

Further, a moisture absorbent is placed around a panel, and the resultant is sealed with etched cap glass, whereby a display apparatus is obtained.

Figure 16:
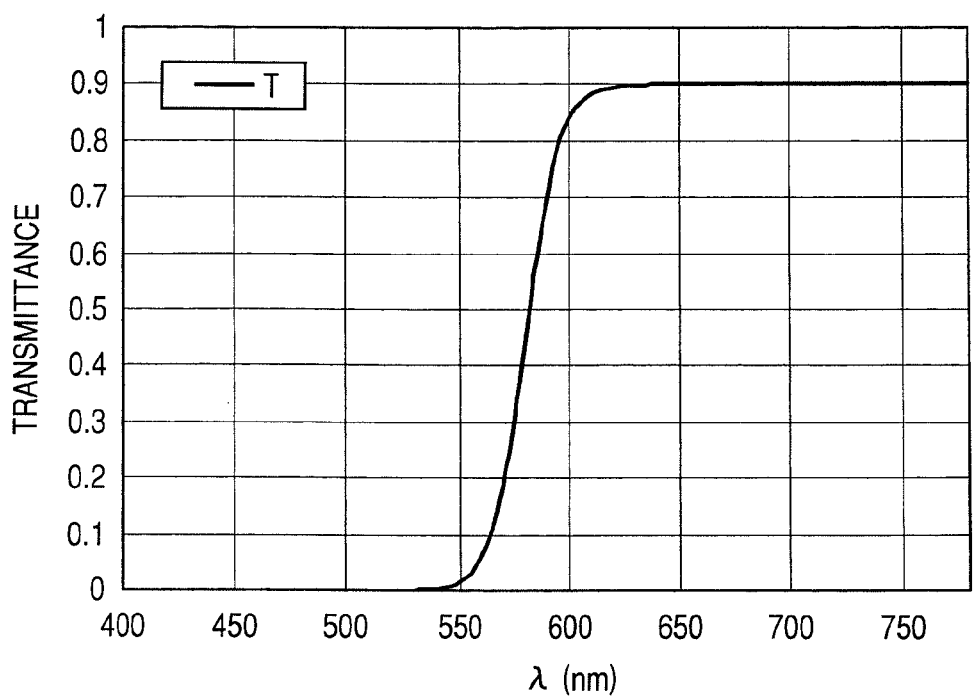
FIG. 16 is a graph exemplifying a spectral transmittance of an R complementary color absorption layer.

After that, an RG color filter is placed on an upper portion of cap glass with an epoxy resin. The RG color filter has a blue pigment patterned onto a B light emitting region on another glass substrate as the B complementary color absorption layer 137 and a red pigment patterned onto an R light emitting region on the substrate as the R complementary color absorption layer 117. FIG. 7 shows the spectral transmittance of the B complementary color absorption layer 137, and FIG. 16 shows the spectral transmittance of the R complementary color absorption layer 117.

Finally, the RB region transmission circularly polarizing plate 142 having a spectral transmittance of 100% and a spectral polarization degree of 0% in each of an R region and a B region, and having a spectral transmittance of 40% and a spectral polarization degree of 100% in any other region is placed on an upper portion of the RG color filter with an adhesive, whereby a display apparatus is obtained.

The display apparatus has a luminous reflectance of 2.93%, so the contrast of the display apparatus can be improved. In addition, the display apparatus has a power consumption of 415.6 mW, which is reduced from a power consumption when an ordinary circularly polarizing plate is used, that is, 680 mW by about 40%.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application Nos. 2006-264091 filed Sep. 28, 2006 and 2007-230941 filed Sep. 6, 2007, which are hereby incorporated by their reference herein.

What is claimed is:

1. A display apparatus comprising:
a plurality of pixels, each pixel including a plurality of sub-pixels which emit light of different colors, each sub-pixel including a light-emitting device; and
a circularly polarizing member placed on a light extraction side of each of the light-emitting devices,
wherein a first region of the circularly polarizing member, said first region corresponding to a sub-pixel emitting a first color, has a higher transmittance for the first color than a transmittance for any other color, and
wherein a second region of the circularly polarizing member, said second region corresponding to a sub-pixel emitting a color which is different from the first color, has a lower transmittance for the first color than the transmittance for the first color of the first region of the circularly polarizing member.

2. The display apparatus according to claim 1, wherein the first region of the circularly polarizing member comprises a decomposed dyestuff.

3. The display apparatus according to claim 1, further comprising an absorption layer on the light extraction side of the light-emitting device included in the sub-pixel emitting the first color, wherein the absorption layer absorbs a complementary color of the first color.

4. The display apparatus according to claim 1, wherein the light-emitting device included in the sub-pixel emitting the first color has a pair of reflecting surfaces, and an optical distance between the pair of reflecting surfaces is set so that a spectral reflectance of the light-emitting device included in the sub-pixel emitting the first color takes one of a minimum value and a local minimum value in a wavelength range of the first color.

5. The display apparatus according to claim 1, wherein the light-emitting device included in a sub-pixel emitting a color except the first color has a reflecting layer, and the reflecting layer has a minimum value for a spectral reflectance in a wavelength range of the first color of less than 50%.

6. The display apparatus according to claim 1, further comprising a black matrix between two adjacent devices of the light-emitting devices.

7. The display apparatus according to claim 1, wherein the first color comprises a color emitted by a sub-pixel including a light-emitting device having the lowest emission efficiency.

8. The display apparatus according to claim 1, wherein the first color comprises a color emitted by a sub-pixel including a light-emitting device having the largest driving current density.

9. The display apparatus according to claim 1, wherein the light-emitting device is an organic electroluminescence device.

10. The display apparatus according to claim 1, wherein the different colors include a red color, a green color, and a blue color, and the first color comprises the blue color.

11. The display apparatus according to claim 1,
wherein a region of the circularly polarizing member, said region corresponding to a sub-pixel emitting a second color which is different from the first color, has a higher transmittance for the second color than a transmittance for any other color.

12. The display apparatus according to claim 1, wherein the first region is different from the second region in wavelength dispersion of transmittance of the circularly polarizing member.

13. A display apparatus comprising:
a first light-emitting device which emits light of a first color;

a second light-emitting device which emits light of a second color different from the first color;
a circularly polarizing member on a light extraction side of each of the light-emitting devices;
wherein a first region of the circularly polarizing member, said first region corresponding to the first light-emitting device, has a higher transmittance for the first color than a transmittance for any other color, and
wherein a second region of the circularly polarizing member, said second region corresponding to the second light-emitting device, has a lower transmittance for the first color than the transmittance for the first color of the first region.

14. A display apparatus comprising:
a first light-emitting device which emits light of a first color;
a second light-emitting device which emits light of a second color different from the first color;
a circularly polarizing member on a light extraction side of each of the light-emitting devices;
wherein transmittance for the first color, which transmits in a region of the circularly polarizing member corresponding to the first emitting device, is higher than transmittance for the second color, which transmits in a region of the circularly polarizing member corresponding to the first emitting device, and
wherein transmittance for the first color, which transmits in a region of the circularly polarizing member corresponding to the second emitting device, is lower than transmittance for the second color, which transmits in a region of the circularly polarizing member corresponding to the first emitting device.

* * * * *